US009098667B1

(12) United States Patent
McCracken et al.

(10) Patent No.: US 9,098,667 B1
(45) Date of Patent: Aug. 4, 2015

(54) METHODS, SYSTEMS, AND ARTICLES OF MANUFACTURE FOR IMPLEMENTING PHYSICAL DESIGNS WITH FORCE DIRECTED PLACEMENT OR FLOORPLANNING AND LAYOUT DECOMPOSITION

(71) Applicant: Cadence Design Systems, Inc., San Jose, CA (US)

(72) Inventors: Thaddeus C. McCracken, Portland, OR (US); Joseph P. Jarosz, Sunnyvale, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 13/842,684

(22) Filed: Mar. 15, 2013

(51) Int. Cl.
*G06F 17/50* (2006.01)
(52) U.S. Cl.
CPC .................... *G06F 17/5072* (2013.01)
(58) Field of Classification Search
USPC .................................. 716/118–125
See application file for complete search history.

(56) References Cited

U.S. PATENT DOCUMENTS

| 5,682,322 | A | 10/1997 | Boyle et al. |
| 5,910,897 | A * | 6/1999 | Dangelo et al. ............... 716/102 |
| 6,026,223 | A | 2/2000 | Scepanovic et al. |
| 7,469,143 | B2 | 12/2008 | Jain et al. |
| 8,046,313 | B2 | 10/2011 | Hoffberg et al. |
| 8,587,102 | B2 | 11/2013 | Leedy |
| 2003/0079192 | A1 | 4/2003 | Cheong et al. |
| 2004/0230931 | A1 | 11/2004 | Barbee et al. |
| 2007/0147269 | A1 | 6/2007 | Ettle et al. |
| 2007/0294648 | A1 | 12/2007 | Allen et al. |
| 2008/0216040 | A1 * | 9/2008 | Furnish et al. ................... 716/10 |
| 2009/0031265 | A1 | 1/2009 | Papadopoulou et al. |
| 2009/0254874 | A1 * | 10/2009 | Bose .................................. 716/6 |
| 2013/0283225 | A1 | 10/2013 | Alpert et al. |

OTHER PUBLICATIONS

"Geometric Algorithms" URL: http://www.cs.princeton.edu/~rs/AlgsDS07/16Geometric.pdf, 2007.
"Voronoi Diagram" URL: http://mathworld.wolfram.com/VoronoiDiagram.html, 1999.
Adya, Saurabh N., and Igor L. Markov. "Fixed-outline floorplanning: Enabling hierarchical design." Very Large Scale Integration (VLSI) Systems, IEEE Transactions on 11.6 (2003): 1120-1135.
Arya et al., "Linear-Size Approximate Voronoi Diagrams" 2002.
Arya, Sunil, Theocharis Malamatos, and David M. Mount. "Space-efficient approximate Voronoi diagrams." Proceedings of the thiry-fourth annual ACM symposium on Theory of computing. ACM, 2002.

(Continued)

*Primary Examiner* — Binh Tat
(74) *Attorney, Agent, or Firm* — Vista IP Law Group, LLP

(57) ABSTRACT

Disclosed are methods, systems, and articles of manufactures for implementing a physical design with force directed placement or floorplanning and layout decomposition by identifying multiple nodes and then iteratively generating multiple cells by using the multiple nodes in a decomposition process and applying force model(s) to iteratively morph the cells until convergence criteria are satisfied to generate a layout or floorplan of an electronic design without requiring complete conductivity for the electronic design. The initially identified custom conductivity information is maintained throughout this iterative process.

25 Claims, 34 Drawing Sheets

(56) References Cited

OTHER PUBLICATIONS

Auber, D., et al. "Animated, Dynamic Voronoi Treemaps." 2010.

Balzer, Michael, Oliver Deussen, and Claus Lewerentz. "Voronoi treemaps for the visualization of software metrics." Proceedings of the 2005 ACM symposium on Software visualization. ACM, 2005.

Chen, Tung-Chieh, et al. "MP-trees: a packing-based macro placement algorithm for mixed-size designs." Design Automation Conference, 2007. DAC'07. 44th ACM/IEEE. IEEE, 2007.

Chen, Tung-Chieh, et al. "MP-trees: A packing-based macro placement algorithm for modern mixed-size designs." Computer-Aided Design of Integrated Circuits and Systems, IEEE Transactions on 27.9 (2008): 1621-1634.

Choi, S-G., and Chong-Min Kyung. "A floorplanning algorithm using rectangular Voronoi diagram and force-directed block shaping." Computer-Aided Design, 1991. ICCAD-91. Digest of Technical Papers., 1991 IEEE International Conference on. IEEE, 1991.

David Austin, "Voronoi Diagrams and a Day at the Beach", URL: http://www.ams.org/samplings/feature-column/fcarc-voronoi, Aug. 2006.

Non-Final Office Action dated Dec. 10, 2013 for U.S. Appl. No. 13/843,706.

Fatemeh Ahmadi Nejad Masouleh, "Constructing Weighted Voronoi Diagrams Using Computer Programs", URL: http://giswin.geo.tsukuba.ac.jp/sis/tutorial/GISHint,fatemeh.pdf, Dec. 2006.

Fruchterman, Thomas MJ, and Edward M. Reingold. "Graph drawing by force-directed placement." Software: Practice and experience 21.11 (1991): 1129-1164.

Guilherme Fonseca, "Approximate Voronoi Diagrams" Mar. 2005.

Guo, Pei-Ning, Chung-Kuan Cheng, and Takeshi Yoshimura. "An O-tree representation of non-slicing floorplan and its applications." Proceedings of the 36th annual ACM/IEEE Design Automation Conference. ACM, 1999.

Hu, Yifan. "Efficient, high-quality force-directed graph drawing." Mathematica Journal 10.1 (2005): 37-71.

Ogniewicz, R., and M. Ilg. "Voronoi skeletons: Theory and applications." Computer Vision and Pattern Recognition, 1992. Proceedings CVPR'92., 1992 IEEE Computer Society Conference on. IEEE, 1992.

Schneider, Jens, Martin Kraus, and Rüdiger Westermann. "GPU-based Real-time Discrete Euclidean Distance Transforms with Precise Error Bounds." VISAPP (1). 2009.

Sud, Avneesh, Danyel Fisher, and Huai-Ping Lee. "Fast dynamic voronoi treemaps." Voronoi Diagrams in Science and Engineering (ISVD), 2010 International Symposium on. IEEE, 2010.

T. Ventimiglia et al., "The Barnes-Hut Algorithm" URL: arborjs.org/docs/barnes-hut, 2003.

Vorwerk, Kristofer, Andrew Kennings, and Anthony Vannelli. "Engineering details of a stable force-directed placer." *Proceedings of the 2004 IEEE/ACM International conference on Computer-aided design*. IEEE Computer Society, 2004.

Final Office Action dated Apr. 22, 2014 for U.S. Appl. No. 13/843,706.

Non-Final Office Action dated Apr. 22, 2014 for U.S. Appl. No. 13/842,791.

Non-Final Office Action dated May 9, 2014 for U.S. Appl. No. 13/843,706.

Sang-Gil Choi and Chong-Min Kyung "A Floorplanning Algorithm Using Rectangular Voronoi Diagram and Force-Directed Block Shaping", Department of Electrical Engineering, Korea Advanced Institute of Science and Technology, 1991 IEEE.

Non-Final Office Action dated Sep. 29, 2014 for U.S. Appl. No. 13/842,791.

Final Office Action dated Sep. 12, 2014 for U.S. Appl. No. 13/842,890.

Notice of Allowance dated Aug. 13, 2014 for U.S. Appl. No. 13/843,706.

Meththa Samaramayake, Helen Ji, and John Ainscorgh "Force Directed Graph Drawing Algorithms for Macro Cell Placement" Proceedings of the World Congress on Engineering 2008 vol. I.

Non-Final Office Action dated Jan. 22, 2015 for U.S. Appl. No. 13/843,706.

\* cited by examiner

METHODS, SYSTEMS, AND ARTICLES OF MANUFACTURE FOR IMPLEMENTING PHYSICAL DESIGNS WITH FORCE DIRECTED PLACEMENT OR FLOORPLANNING AND LAYOUT DECOMPOSITION

CROSS REFERENCE TO RELATED APPLICATION(S)

This application is related to U.S. patent application Ser. No. 13/842,890 entitled "METHODS, SYSTEMS, AND ARTICLES OF MANUFACTURE FOR IMPLEMENTING PHYSICAL DESIGN USING FORCE MODELS", and U.S. patent application Ser. No. 13/843,706 entitled "METHODS, SYSTEMS, AND ARTICLES OF MANUFACTURE FOR IMPLEMENTING PHYSICAL DESIGN DECOMPOSITION WITH CUSTOM CONNECTIVITY", and U.S. patent application Ser. No. 13/842,791 entitled "METHODS, SYSTEMS, AND ARTICLES OF MANUFACTURE FOR PROVIDING INTERACTIVE, CONTINUOUS FEEDBACK IN IMPLEMENTING PHYSICAL DESIGNS USING FORCE DIRECTED PLACEMENT OR FLOORPLANNING AND LAYOUT DECOMPOSITION WITH CUSTOM CONNECTIVITY", the content of the three applications is hereby incorporated by reference in its entirety for all purposes.

COPYRIGHT NOTICE

A portion of the disclosure of this patent document contains material, which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

BACKGROUND

A modern IC design, an IP (intellectual property) cell in the IC (integrated circuit) core area may communicate and exchange data with certain IP cells in the IC core area via certain part(s) in the outer I/O (input/output) ring and thus need to stay within some close proximity of the corresponding portion in the I/O ring. During the early design planning stages where design data are scarce and incomplete at best, an architect may have to determine what the fabric need to look like in order to meet various criteria, such as functional requirements, I/O conductivity or connectivity, fabric configuration, etc.

Moreover, some of the design criteria may compete with some other design criteria, and the conflicting criteria may further exacerbate the challenges. Traditional approaches typically receive, for example, the functional requirements for a design, model the design in terms of the flow of the signals and the logic operations on these signals in RTL (register transfer level), synthesize the RTL, and perform prototyping using the netlist from the synthesis. Nonetheless, such conventional approaches may not property serve prototyping, IO planning, feasibility analysis, or floorplanning in early design stages where the details of the design are lacking or to be determined. Therefore, what is needed is a method, system, and computer program product for implementing physical design decomposition with custom connectivity.

SUMMARY

Disclosed are various embodiments of methods, systems, and articles of manufactures for implementing physical designs with force directed placement or floorplanning and layout decomposition. Some embodiments identify custom, incomplete conductivity for an electronic design from, for example, some user specified conductivity that requires some portion of the electronic design to communicate or exchange data with another portion of the electronic design. These embodiments may then partition a physical design space of the electronic design into a plurality of cells that are, by their nature, non-overlapping and iteratively move at least some of the nodes of the plurality of cells until one or more convergence criteria are satisfied while maintaining the custom, incomplete conductivity through the entire partitioning process.

These embodiments generate a floorplan or a placement layout that resembles the final floorplan obtained through the complete floorplanning process or the final placement layout through the complete placement process without requiring or assuming that complete conductivity information is provided to the floorplanner or placement tool. In some embodiments, various processes described herein generate the floorplan or placement layout, which resembles the final floorplan obtained through the complete floorplanning process or the final placement layout through the placement process, without requiring any detailed information about a block or cell to be used in an electronic design. For example, various embodiments do not need to have any information of the input(s), output(s), pin(s), terminal(s), pad(s), etc. of an IP block or cell to be used in an electronic design in order to generate a credible, realistic floorplan or placement layout that resembles the final floorplan or placement layout. In some embodiments, various processes described herein generate the floorplan or placement layout, which resembles the final floorplan obtained through the complete floorplanning process or the final placement layout through the placement process, without requiring a complete netlist.

In some embodiments, various processes described herein generate the floorplan or placement layout, which resembles the final floorplan obtained through the complete floorplanning process or the final placement layout through the placement process, without any netlist at all because these described processes may generate such a credible floorplan or placement to resemble the final floorplan or placement layout based at least in part on the conductivity information, which may be incomplete and merely specifies one portion of a design is to communicate or exchange data with another portion of the design without specifying how these two portions are connected. In some embodiments, various processes described herein generate the floorplan or placement layout, which resembles the final floorplan obtained through the complete floorplanning process or the final placement layout through the placement process, without performing the synthesis process on, for example, the RTL (register transfer level) level design.

Various embodiments implement a physical design by using multiple force models, which include one or more attractive force models, one or more repulsive models, or combinations thereof, to iteratively morph a layout decomposition that includes a plurality of cells by using the force models to move at least some nodes of the plurality of cells and then to re-partition the design based at least in part on these nodes that have been moved to new locations by the force models. In addition to attractive force model(s) or repulsive force model(s), some embodiments also use a containment force model for grouping multiple design blocks or cells or for confining a node of a cell within the boundary of a container.

Some embodiments are directed at deriving a first force model at the first hierarchical level from a second force model at the second hierarchical level by directly modifying the second model based at least in part on one or more characteristics of the first hierarchical level and the corresponding one or more characteristics of the second hierarchical level. In a design with multiple hierarchies, some embodiments may use a cell-based force model to ensure that the child nodes of a parent cell stay close to the parent node of the parent cell. Some embodiments use the force models to operate on a set of cells representing decomposition of a layout area so as to determine a placement layout or a floorplan while maintaining custom, incomplete conductivity information. Various embodiments described herein use force models and decomposition engine(s) and do not require that complete conductivity information be provided in order to generate a placement layout or floorplan, which resembles a final placement layout or a final floorplan, for quick feasibility studies or quick prototyping, without using conventional placement tool or floorplanner.

Some embodiments employ the use of a force model, which models the interaction between two features in a design by using both the attraction and repulsion forces. The force model enables the designer or the architect to observer the results of floorplanning or IO (input/output) planning in early stages of the electronic design while maintaining specific connectivity requirement(s). A typical example of a specific connectivity requirement is a user specified connectivity between a circuit feature (e.g., a cell) in the IC core area and another circuit feature (e.g., a pin or an IO cell) in the ring area of the IC design.

The force model may incrementally calculate the attractive forces and/or repulsive forces for each circuit feature (e.g., a cell or a node) that are interconnected with another circuit feature, determines the resultant force for the circuit feature, and then moves the circuit feature according to the resultant force. The force model then iteratively recalculates the resultant force for each circuit feature until a convergence criterion is met. An example of such a convergence criterion is when the variation of some energy (e.g., potential energy) of the electronic design is smaller than or equal to a predetermined threshold value. The force model may constrain the move of each circuit feature by using a container that limits the range in which the circuit feature may be moved in some embodiments. The boundary of a core cell, a pin, an IO cell, or any elements of a physical hierarchy may serve as a container for the cell or the pin under consideration for the determination of the attractive and repulsive forces for the cell or pin.

In some embodiments, the repulsive force may be modeled as electrical repulsive force between the two circuit features, both of which may be modeled as electrical charges of the same polarity. In some embodiments, the repulsion may be modeled as the restoring force of a spring connecting both circuit features. In some embodiments, the attractive force may be modeled as a spring force model having a spring connected between two circuit features or gravitational pull between these two circuit features whose "weights" are proportional to their respective areas. The force model may work with any decomposition or partitioning schemes and may model various forms of requirements or constraints in terms of attractive and/or repulsive forces such that all the required or desired requirements, including conflicting requirements, may be accommodated during the early stages of the electronic design.

Some embodiments are directed at a hardware system that may be invoked to perform any of the methods, processes, or sub-processes disclosed herein. The hardware system may include at least one processor or at least one processor core, which executes one or more threads of execution to perform any of the methods, processes, or sub-processes disclosed herein in some embodiments. The hardware system may further include one or more forms of non-transitory machine-readable storage media or devices to temporarily or persistently store various types of data or information. Some exemplary modules or components of the hardware system may be found in the System Architecture Overview section below.

Some embodiments are directed at an article of manufacture that includes a non-transitory machine-accessible storage medium having stored thereupon a sequence of instructions which, when executed by at least one processor or at least one processor core, causes the at least one processor or the at least one processor core to perform any of the methods, processes, or sub-processes disclosed herein. Some exemplary forms of the non-transitory machine-readable storage media may also be found in the System Architecture Overview section below.

BRIEF DESCRIPTION OF THE FIGURES

The drawings illustrate the design and utility of various embodiments. It should be noted that the figures are not drawn to scale and that elements of similar structures or functions are represented by like reference numerals throughout the figures. In order to better appreciate how to obtain the above-recited and other advantages and objects of various embodiments, a more detailed description of the inventions briefly described above will be rendered by reference to specific embodiments thereof, which are illustrated in the accompanying drawings. Understanding that these drawings depict only typical embodiments of the invention and are not therefore to be considered limiting of its scope, the invention will be described and explained with additional specificity and detail through the use of the accompanying drawings in which.

DETAILED DESCRIPTION OF ILLUSTRATED EMBODIMENTS

Various embodiments are directed to a method, system, and computer program product for implementing and using virtual sales process engineering. Other objects, features, and advantages of the invention are described in the detailed description, figures, and claims.

Various embodiments of the methods, systems, and articles of manufacture will now be described in detail with reference to the drawings, which are provided as illustrative examples of the invention so as to enable those skilled in the art to practice the invention. Notably, the figures and the examples below are not meant to limit the scope of various embodiments, unless otherwise specifically described in particular embodiment(s) or recited in the claim(s). Where certain elements of embodiments may be partially or fully implemented using known components (or methods or processes), portions of such known components (or methods or processes) that are necessary for an understanding of the present invention will be described, and the detailed descriptions of other portions of such known components (or methods or processes) will be omitted for ease of explanation and to not obscure embodiments of the invention. Further, embodiments encompass present and future known equivalents to the components referred to herein by way of illustration. More details about various processes or modules to implement various embodiments are further described below with reference to FIGS. 1-15.

Figure 1:
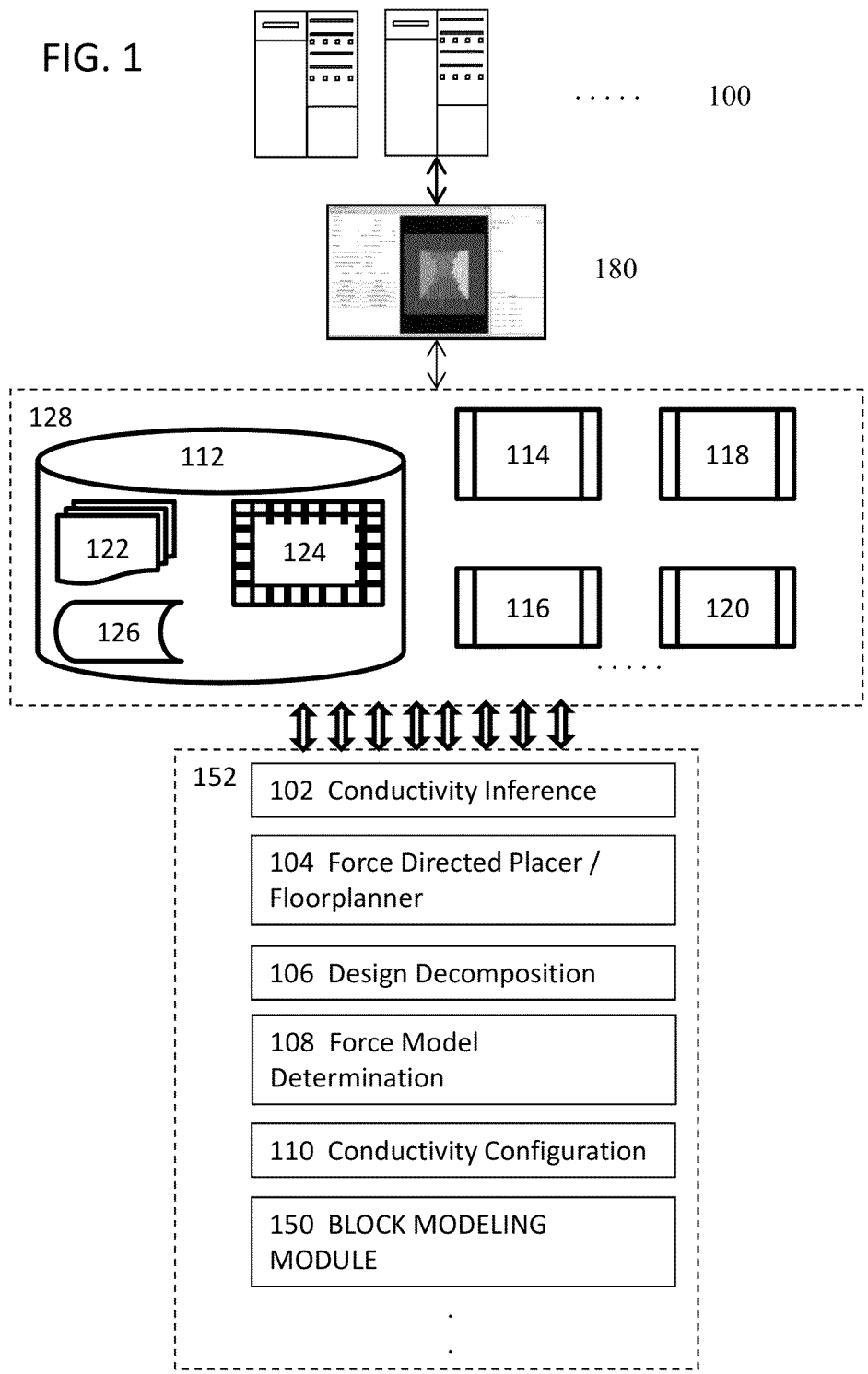
FIG. 1 illustrates a schematic representation of exemplary implementations for implementing physical designs with force directed placement or floorplanning and layout decomposition in some embodiments.

FIG. 1 illustrates a high level block diagram for implementing physical design decomposition with custom connectivity in some embodiments. In one or more embodiments, the system for implementing physical design decomposition with custom connectivity may comprise one or more computing systems 100, such as a general purpose computer described in the System Architecture Overview section to operate on an electronic design 180 in order to implement one or more special proposes.

In some embodiments, the one or more computing systems 100 may invoke various system resources such as the processor(s) or processor core(s), memory, disks, etc. The one or more computing systems 100 may also initiate or interact with other computing systems to access various resources 128 that may comprise a global routing engine and/or a detail routing engine 114, a layout editor 116, a design rule checker 118, a verification engine 120, etc. The one or more computing systems 100 may further write to and read from a local or remote volatile or non-volatile computer accessible storage 112 that stores thereupon data or information such as, but not limited to, one or more databases (124) such as schematic design database(s) or physical design database(s), libraries, data, rule decks, constraints, etc. (122), or other information or data (126) that may be used to facilitate the performance of various functions to achieve the intended purposes.

In some embodiments, the one or more computing systems 100 may, either directly or indirectly through various resources 128, invoke various software, hardware modules, or a combination thereof 152 that may comprise a conductivity or connectivity (hereinafter conductivity) inference module 102 to infer conductivity for a physical design or a portion thereof, a force directed placement or floorplanning module 104 to perform the placement or floorplanning functions for the physical design or a portion thereof, a design decomposition or partitioning module 106 to partition an area of a physical design into a plurality of cells, regions, or blocks (hereinafter cells) either alone or jointly with one or more other modules, a force model determination modules 108 to determine various characteristics, parameters, variables, etc. for one or more force models, or a conductivity reconfiguration engine 110 to reconfigure some conductivity for a physical design or a portion thereof, etc.

Figure 2:
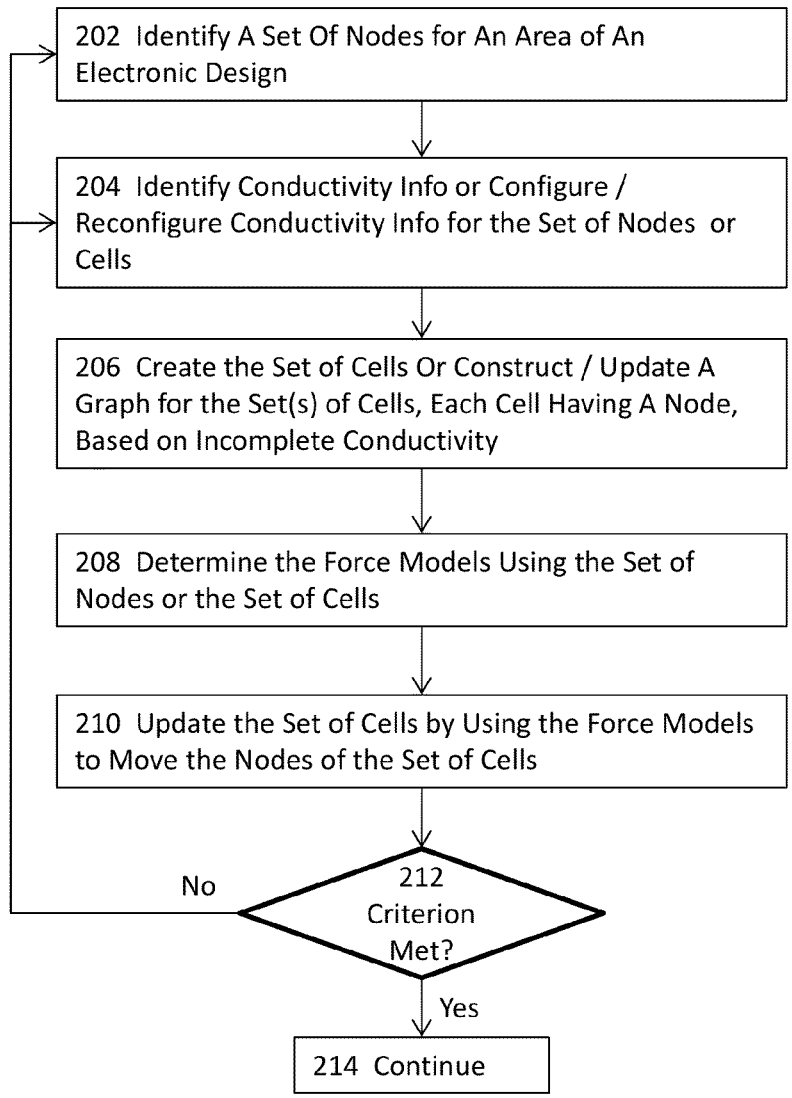
FIG. 2 illustrates a top level flow diagram for implementing physical designs with force directed placement or floorplanning and layout decomposition in some embodiments.

FIG. 2 illustrates a top level flow diagram for implementing physical designs with force directed placement or floorplanning and layout decomposition in some embodiments. In one or more embodiments, the method for implementing physical designs with force directed placement or floorplanning and layout decomposition may comprise the process 202 of identifying a set of nodes for a physical design area of an electronic design, if the set of cells has been generated.

In some embodiments, the method may comprise the process 204 of identifying conductivity information or configure or reconfigure conductivity information for the set of nodes or for the set of cells if the set of cells is identified at 202. In some embodiments, the conductivity information may comprise partial, incomplete conductivity for the physical design area of the electronic design. In some embodiments, the conductivity information may comprise user specified conductivity information. In some embodiments, the conductivity information does not necessarily dictate how a first design block (e.g., an intellectual property or IP block or generally any group of electronic design components of an electronic design) is precisely connected to other blocks. Rather, the conductivity information may merely indicate that the first design block communicates with (e.g., exchanging data) or and is thus somehow connected to these other blocks. That is, the conductivity information does not necessarily specify, for example, which port of one design block is to be connected to another port of another design block but simply indicates that a design block communicates to another design block. It shall be noted that the terms conductivity and connectivity are used interchangeably, unless otherwise specifically recited or claimed. More details are described in U.S. patent application Ser. No. 13/843,706 entitled "METHODS, SYSTEMS, AND ARTICLES OF MANUFACTURE FOR IMPLEMENTING PHYSICAL DESIGN DECOMPOSITION WITH CUSTOM CONNECTIVITY", the content of which is hereby incorporated by reference in its entirety for all purposes.

In some embodiments, the method may comprise the process 206 of creating a set of cells, each of which contains a node (e.g., a Voronoi generation node) in the set of nodes identified at 202, based on the conductivity information identified at 204. In some embodiments, process 206 creates the set of cells by using Voronoi decomposition process that generates the set of Voronoi cells by using the Voronoi decomposition process. More details about the Voronoi cells are described in are described in U.S. patent application Ser. No. 13/843,706 entitled "METHODS, SYSTEMS, AND ARTICLES OF MANUFACTURE FOR IMPLEMENTING PHYSICAL DESIGN DECOMPOSITION WITH CUSTOM CONNECTIVITY", the content of which is hereby incorporated by reference in its entirety for all purposes.

In some embodiments, the graph constructed or updated at 206 may be used in force directed placement or floorplanning to determine the locations of the nodes using one or more force models based at least in part upon the conductivity information. In some embodiments where the set of cells has not been created such as the case when the physical design area has not been partitioned, process 206 may construct the graph using a set of nodes that is provided for partitioning the physical design area. The set of nodes may represent, for example, the top level blocks, cells, macros, etc. that belong to the highest hierarchical level of the electronic design that may be obtained or derived from, for example, the functional specification of the electronic design.

In some embodiments, the method may comprise the process 208 of determining force models for the graph. In some embodiments, process 208 may determine one or more force models using the set of nodes identified at 202 or the set of cells created at 206. In some embodiments where the physical design space has not been partitioned, and thus the set of cells has not been created, process 208 may then determine one or more force models that can be determined with the characteristics of the cells such as the spring attractive force model, the electrical repulsive force model, the containment force model, etc. In some embodiments where the set of cells has been identified at 202, process 208 may thus generate all needed force models.

In some embodiments, the one or more force models comprise a containment force model, a cell-based force model, or a Voronoi attractive force model. More details about the force models are described in are described in U.S. patent application Ser. No. 13/843,706 entitled "METHODS, SYSTEMS, AND ARTICLES OF MANUFACTURE FOR IMPLEMENTING PHYSICAL DESIGN USING FORCE MODELS", the content of which is hereby incorporated by reference in its entirety for all purposes.

In some embodiments, the method may comprise the process 210 of updating the set of cells by using the force models to move at least some of the nodes of the set of cells to the respective new locations. In some embodiments where the set of cells has not been generated, process 210 may use the force models generated at 208 and apply various forces on the nodes identified at 202 based at least in part upon the conductivity information. These various forces acting on a node are thus added by using vector operations to determine the resultant force for the node. The result node may thus move the node.

It shall be noted that the forces acting on a node may change when the node moves. In some embodiments where a set of Voronoi cells is identified at 202, the set of Voronoi cells also changes when the nodes move and further changes the forces that are determined based at least in part upon the cells. In some embodiments where a set of Voronoi cells has been used, the set of Voronoi cells continuously changes with the move of the nodes, and process 210 may continuously update the set of Voronoi cells as the set of nodes continuously move.

In some embodiments, the method may comprise the process 212 of determining whether one or more convergence criteria have been satisfied. In some embodiments where the graph is constructed with a set of cells (e.g., the set of cells identified at 202), the one or more convergence or stopping criteria may comprise, for example but not limited to, a reduced or a minimum energy level. In some embodiments where the set of cells has been identified at 202, the one or more convergence or stopping criteria may comprise, for example but not limited to, a target area requirement or goal (hereinafter goal), a wire length goal, a timing goal, a reduced or minimum energy level, etc.

In some embodiments where the one or more convergence or stopping criteria are not satisfied, the method may return to 202 to update or create the set of cells with the set of nodes at the new locations. In some embodiments where the one or more criteria are not satisfied, the method may return to 204 to configure or reconfigure the conductivity information. More details about configuring or reconfiguring the conductivity information are described in U.S. patent application Ser. No. 13/843,706 entitled "METHODS, SYSTEMS, AND ARTICLES OF MANUFACTURE FOR IMPLEMENTING PHYSICAL DESIGN DECOMPOSITION WITH CUSTOM CONNECTIVITY", the content of which is hereby incorporated by reference in its entirety for all purposes. In embodiments where the one or more convergence or stopping criteria are satisfied at 212, the method may proceed to 214 to continue with, for example, storing the generated floorplan or placement layout for the physical design area using the final set of cells.

Figure 3:
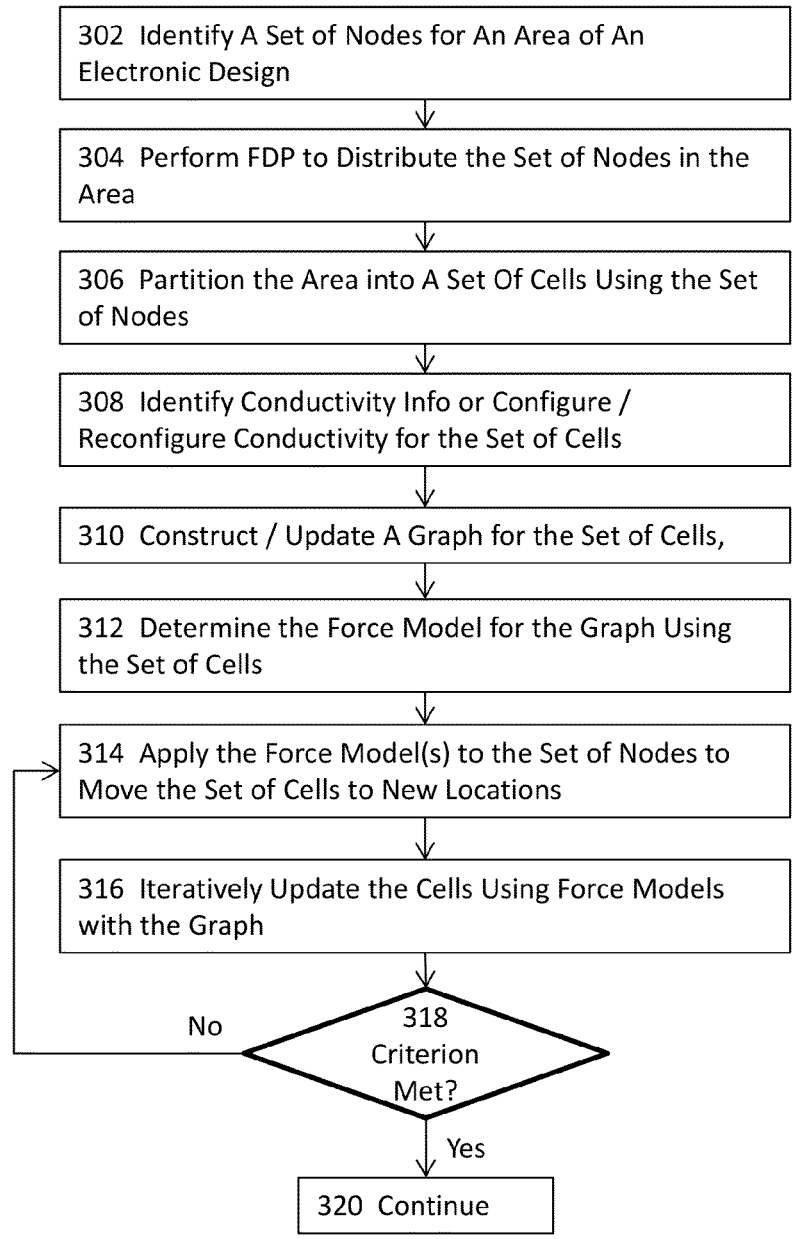
FIG. 3 illustrates more details about a more detailed flow diagram for implementing physical designs with force directed placement or floorplanning and layout decomposition in some embodiments.

FIG. 3 illustrates more details about a more detailed flow diagram for implementing physical designs with force directed placement or floorplanning and layout decomposition in some embodiments. In one or more embodiments, the method may comprise the process 302 of identifying a set of nodes for an area of an electronic design. In these embodiments illustrated in FIG. 3, the method uses a decomposition process to partition the design by using the set of nodes.

In some embodiments, the method may comprise the process 304 of performing force based placement or floorplanning to distribute the set of nodes in the physical design area. In some embodiments, process 304 performs the force based placement or floorplanning by using a graph constructed based on the set of nodes. In some embodiments, process 304 performs the force based placement or floorplanning by using some conductivity information and the set of nodes. In the absence of conductivity information, the method may distribute the set of nodes within the physical design area and then infer conductivity between some adjacent nodes in one or more different ways. For example, the method may first uniformly or randomly distribute the set of nodes within the physical design area and infer conductivity among some adjacent nodes based at least in part upon, for example, functional requirements, conductivity in other related designs, etc.

In some embodiments, the method may comprise the process 306 of partitioning the area into a set of cells using the set of nodes. In some embodiments where the design is partitioned into a plurality of Voronoi cells, the set of nodes represent the Voronoi generation nodes. In some embodiments, the method may comprise the process 308 of identifying conductivity information or configuring or reconfiguring the conductivity information for the set of cells in a substantially similar manner as that described for 204.

In some embodiments, the method may comprise the process 310 of constructing a graph for the set of cells or updating the graph if the graph has already been constructed based at least in part upon the conductivity information. For example, the conductivity information may require that a first node in the set of nodes be connected to a second node or to a particular component such as an IO cell. Process 310 may then create or update the graph by using at least the conductivity information. The conductivity information may be partial and incomplete in some embodiments. The method may thus further infer additional conductivity information. More details about inferring, configuring, or reconfiguring conductivity information are described in U.S. patent application Ser. No. 13/843,706 entitled "METHODS, SYSTEMS, AND ARTICLES OF MANUFACTURE FOR IMPLEMENTING PHYSICAL DESIGN DECOMPOSITION WITH CUSTOM CONNECTIVITY", the content of which is hereby incorporated by reference in its entirety for all purposes.

In some embodiments, the method may comprise the process 312 of determining one or more force models for the graph using at least the set of cells in a substantially similar manner as that described for 208. In some embodiments, the method may comprise the process 314 of applying the one or more force models on the set of nodes to move the set of nodes to the respective new locations in a substantially similar manner as that described for 210. In some embodiments, the method may comprise the process 316 of iteratively updating the set of cells based at least in part on the results of process 314.

In some embodiments, the method may comprise the process 318 of determining whether one or more convergence or stopping criteria are satisfied. For example, process 318 may determine whether the set of cells meet certain prescribed standard deviation from the target area goal. In some embodiments where the one or more convergence criteria are not satisfied, the method may return to 314 to repeat the processes 314~318 until the one or more convergence or stopping criteria are satisfied. Otherwise, the method may proceed to 320 to continue with, for example, storing the generated floorplan or placement layout for the physical design area using the final set of cells.

Figure 4A:
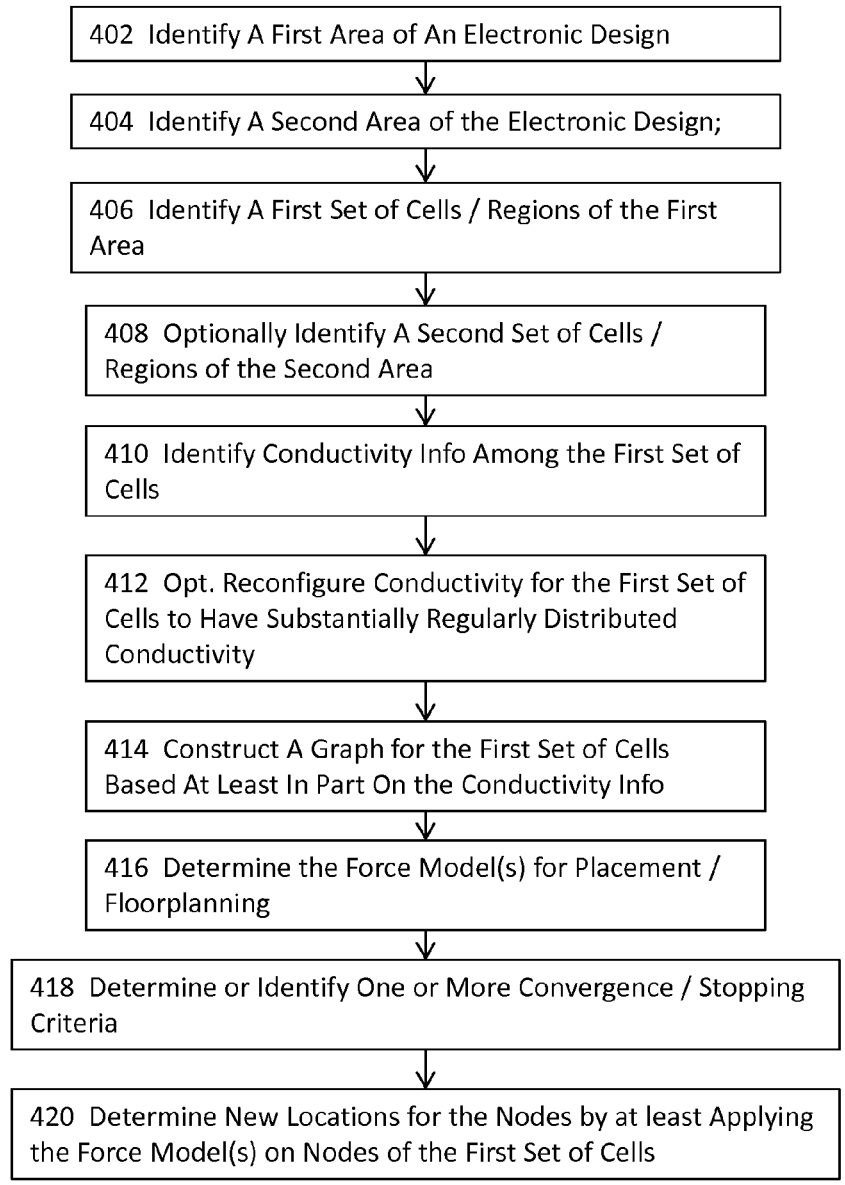
FIGS. 4A-B jointly illustrate a more detailed flow diagram for implementing physical designs with force directed placement or floorplanning and layout decomposition in some embodiments.
Figure 4B:
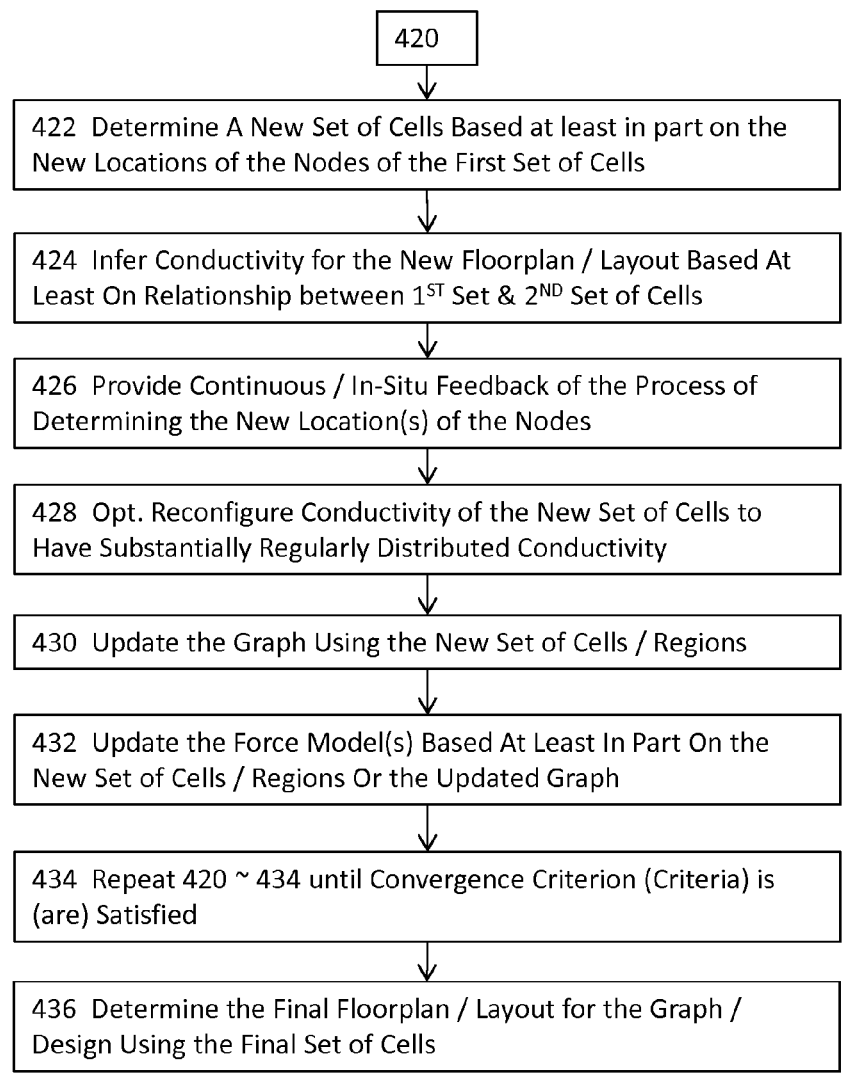

FIGS. 4A-B jointly illustrate a more detailed flow diagram for implementing physical designs with force directed placement or floorplanning and layout decomposition in some embodiments. In one or more embodiments, the method illustrated in FIGS. 4A-B may comprise the process 402 of identifying a first physical design area of an electronic design. In some embodiments, the first physical design area comprises the core area of an electronic design.

In some embodiments, the method may comprise the process 404 of identifying a second physical design area of the electronic design. In some embodiments, the second physical design area comprises an IO area of the electronic design, and the second set of cells comprise a plurality of IO cells. In some embodiments, the method may comprise the process 406 of identifying a first set of cells that represents decomposition of the first area. In some embodiments, the first set of cells comprises a plurality of Voronoi cells, each of which contains a single node.

In some embodiments, the method may comprise the process 408 of identifying a second set of cells that represents decomposition of the second area. In some embodiments where the second physical design area comprises the IO area of the electronic design, the second set of cells comprises a plurality of IO cells. In some embodiments, the method may optionally comprise the process 410 of identifying conductivity information among the first set of cells. In some embodiments, the conductivity information comprises partial, incomplete conductivity information or user specified conductivity information for the electronic design.

In some embodiments, the method may optionally comprise the process 412 of configuring or reconfiguring the conductivity information for the first set of cells to have substantially regularly distributed conductivity in a substantially similar manner as that described for 204. In some embodiments, the method may comprise the process 414 of constructing or updating a graph for the first set of cells based at least in part on the conductivity information configured or reconfigured at 412.

In some embodiments, the method may comprise the process 416 of determining one or more force models for performing force directed placement or floorplanning for the first physical design area of the electronic design. In some embodiments, the method may optionally comprise the process 418 of determining or identifying one or more convergence or stopping criteria. In some embodiments, the process 418 determines a prescribed energy level as a convergence or stopping criterion by using an energy model that represents the energy level for the first set of nodes and the connected second set of nodes based at least in part on the one or more force models.

In some embodiments, the method may comprise the process 420 of determining new locations for the nodes of the first set of cells by at least applying the one or more force models on the nodes of the first set of cells. In some embodiments, the one or more force models comprise a containment force model, a cell-based force model, or a Voronoi attractive force model. In some embodiments, the method may comprise the process 422 of determining a new set of cells based at least in part upon the new locations of the nodes for the nodes of the first set of cells.

In some embodiments, the method may comprise the process 424 of inferring or deriving additional conductivity information for the new floorplan or new placement layout based at least on one or more relationships between the set cells and the second set of cells. In some embodiments, process 422 infers or derives the additional conductivity information by anchoring one or more first cells in the first set of cells to the corresponding one or more second cells in the second set of cells or one or more corresponding nodes of the cells in the second set of cells. More details about anchoring one cell to another cell or node are described in U.S. patent application Ser. No. 13/843,706 entitled "METHODS, SYSTEMS, AND ARTICLES OF MANUFACTURE FOR IMPLEMENTING PHYSICAL DESIGN DECOMPOSITION WITH CUSTOM CONNECTIVITY", the content of which is hereby incorporated by reference in its entirety for all purposes.

In some embodiments, the method may comprise the process 426 of providing in-situ or continuous feedback of the process of determining the new location(s) of the nodes. Various embodiments utilize one or more force models and a layout decomposition process to iteratively drive the partitioned floorplan or placement layout to meet one or more convergence or stopping criteria. The process 426 may provide nearly real-time, in-situ, and continuous visual feedback during the iterative applications of the force model(s) and the decomposition process as well as the interactions among the force model(s), the decomposition process, and the conductivity inference and configuring engine.

In some embodiments, the method may comprise the process 428 of configuring or reconfiguring the conductivity information for the new set of cells to have substantially regularly distributed conductivity for each cell in the new set. In some embodiments, the method may comprise the process 430 of updating the graph using the new set of cells based at least in part upon, for example, the conductivity information configured or reconfigured at 428.

In some embodiments, the method may comprise the process 432 of updating the one or more force models based at least in part on the new set of cells or the updated graph. In some embodiments, the force models interact with the layout decomposition in a manner that a change in the layout decomposition may lead to one or more changes (e.g., a change in the area of a cell) in one or more of the force models. In these embodiments, various force models iteratively drive the nodes of the cells in the layout decomposition and thus also modify the cells generated based on the nodes.

In addition or in the alternative, certain force models are determined based at least in part upon the conductivity information for the cells or the graph. The inference, configuration, or reconfiguration of the conductivity by, for example, the conductivity inference module 102 or the conductivity configuration or reconfiguration module 110 may also affect such force models in some embodiments. The process 432 thus may update at least some of the one or more force models by using at least the new set of cells or the conductivity information that has undergone some changes.

In some embodiments, the method may comprise the process 434 of repeating the processes 420~434 until one or more convergence or stopping criteria are satisfied. In some embodiments, the method may comprise the process 436 of determining the final floorplan or placement layout for the graph or the electronic design using the final set of cells.

Figure 5:
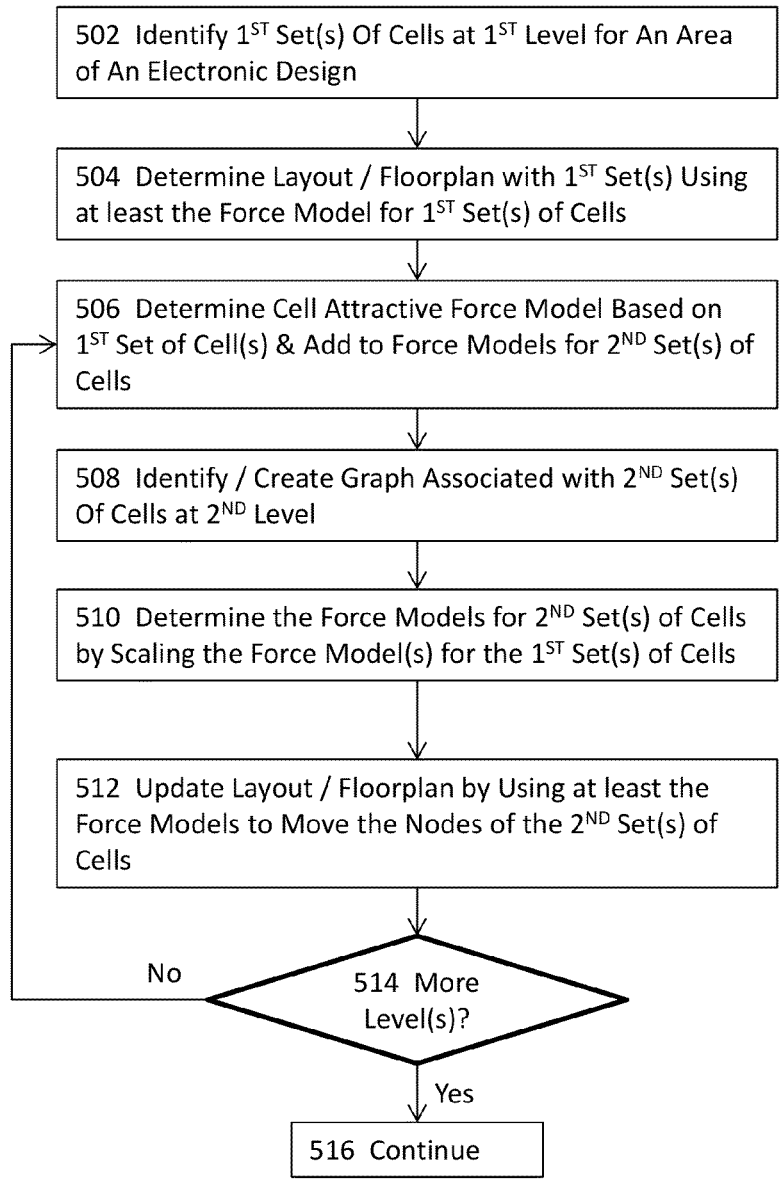
FIG. 5 illustrates a top level flow diagram for implementing a physical design having multiple hierarchical levels using one or more force models in some embodiments.

FIG. 5 illustrates a top level flow diagram for implementing a physical design having multiple hierarchical levels using one or more force models in some embodiments. In one or more embodiments, the method illustrated in FIG. 5 may comprise the process 502 of identifying a first set of cells at a first hierarchical level for an area of an electronic design. In some embodiments where a top-down approach is adopted, the first hierarchical level represents the highest hierarchical level of the electronic design.

In some embodiments, the method may comprise the process 504 of determining the placement layout or the floorplan using at least one or more force models described herein on the first set of cells. For example, the method may determine to use one or more attractive force models, one or more repulsive force models, a containment force model, and a cell-based force model for a user-defined, physical electronic design (e.g., the edges or nodes in a graph layout comprise user-defined elements) in some embodiments. The method may also determine to use one or more attractive force models (e.g., Voronoi attractive force model or cell attractive force model) and a containment force model for a physical electronic design that is derived by using the Voronoi-based graph layout to drive a Voronoi diagram to the target area convergence or stopping criterion in some embodiments. The method may also determine to use one or more attractive force models (e.g., Voronoi attractive force model or cell attractive force model), one or more repulsive force models, and a containment force model for a physical electronic design that is derived by using the Voronoi-based graph layout to drive a Voronoi diagram to the target area convergence or stopping criterion in some embodiments.

In some embodiments, the method may comprise the process 506 of determining the cell attractive force model based at least in part on the first set of cell and adding the cell attractive force model to the force models that are used for the second sets of cells. In these embodiments, the additional cell attractive force model will also be used to calculate the attractive force vectors, in addition to the other force model(s). In some embodiments, the method may comprise the process 508 of identifying or creating a graph by using the second set of cells at the second hierarchical level. In some embodiments, the graph includes vertices, each of which represents a cell in the second set, and edges, each of which indicates two nodes are connected in the graph as indicated by the conductivity information.

In some embodiments, the method may comprise the process 510 of determining the force models that are used for the second set of cells at the second hierarchical level by scaling or modifying the corresponding force models for the first set of cells at the first hierarchical level. More details about process 510 are described in U.S. patent application Ser. No. 13/843,706 entitled "METHODS, SYSTEMS, AND ARTICLES OF MANUFACTURE FOR IMPLEMENTING PHYSICAL DESIGN USING FORCE MODELS", the content of which is hereby incorporated by reference in its entirety for all purposes.

Figure 6:
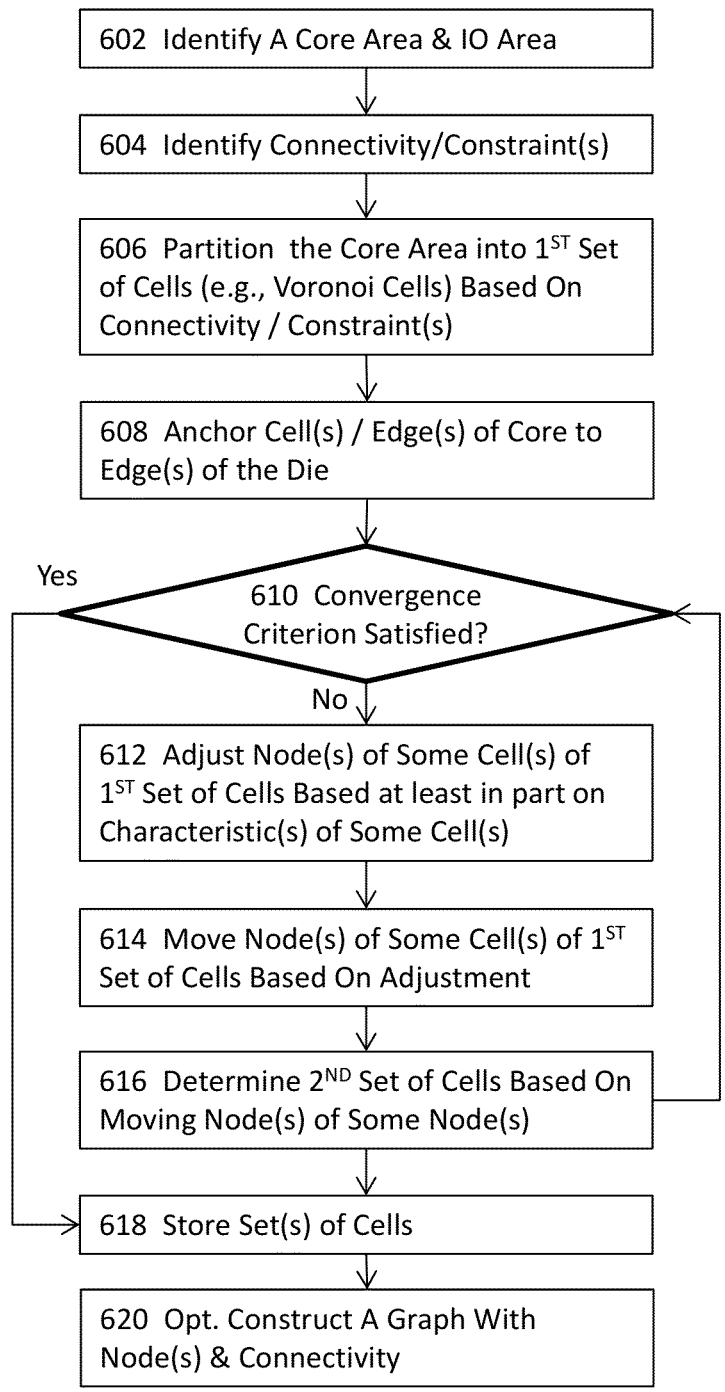
FIG. 6 illustrates more details about a top level flow diagram for implementing physical design decomposition with custom connectivity in some embodiments.

In some embodiments, the method may comprise the process 512 of updating the placement layout or the floorplan by using at least the force models to move the nodes of the second set of cells. In some embodiments, the method iteratively moves the nodes of the second set of cells until one or more convergence or stopping criteria are satisfied. In some embodiments, the method may comprise the process 514 of determining whether there is an additional hierarchical level to be further processed. In some embodiments where there is an additional hierarchical level to be further processed, the method may return to 506 and repeat the processes 506~514 until all the levels of interest have been processed. Otherwise, the method may proceed to 516 to continue with, for example, storing the generated FIG. 6 illustrates more details about a top level flow diagram for implementing physical design decomposition with custom connectivity in some embodiments. In one or more embodiments, the method for implementing physical design decomposition with custom connectivity may comprise the process 602 of identifying a core area and an IO area completely or substantially surrounding or enclosing the core area of a die (e.g., an electronic design.) In some embodiments, the method may comprise the process 604 of identifying conductivity information. In some of these embodiments, the conductivity information includes user specified conductivity.

In some embodiments, the method may comprise the process 606 of partitioning the core area into a first set of cells, each containing a node, based at least in part upon the conductivity information identified at 604. In some embodiments, the first set of cells comprise a plurality of Voronoi cells. In some embodiments, the total number of cells into which a design is to be partitioned is known in advance. That is, the partitioning process (e.g., process 306) partitions an area of a design into a given number of cells while observing some custom conductivity and satisfying one or more criteria. In some embodiments, the method may comprise the process 608 of anchoring one or more edges or cells at the edges of the core area to one or more edges of the die while observing or maintaining the conductivity information identified at 604.

In some embodiments, the process 608 may anchor an edge or a cell at the edge. For example, the process 608 may interact with a force directed placement engine to define the boundary of an IO cell in the IO area as a container and use an attractive force model between the IO cell and the cell to impose the conductivity between the cell and the IO cell in some of these embodiments. In some embodiments, the process 608 anchors the cells neighboring one or more edges of the core area to at least a part of the IO area (e.g., some IO cells in the IO area.) In some embodiments, the process 608 may anchor the cells neighboring one or more edges of the core area to the corresponding cells in the IO area based at least in part upon one or more criteria that may include, for example but not limited to, wire length requirement(s), timing requirement(s), cell area requirement(s), etc.

In some embodiments, the method may comprise the process 610 of determining whether the first set of cells satisfies one or more convergence or stopping criteria. In some of these embodiments where the process 610 determines that the first set of cells satisfies the one or more convergence or stopping criteria, the method may proceed to 618 to store the first set of cells. In some embodiments where the process 610 determines that the first set of cells does not satisfy the one or more convergence or stopping criteria, the method may further comprise the process 612 of adjusting one or more nodes of one or more cells in the first set of cells based at least in part upon one or more characteristics of the corresponding one or more cells.

In some embodiments where one or more force models are used to move the one or more cells, the process 612 adjusts the one or more nodes based at least in part upon how much attractive force or repulsive force a given node in the one or more nodes is to be associated with. The one or more characteristics may include, for example but not limited to, the actual area of each of the one or more cells corresponding to the one or more nodes being adjusted, the number of neighboring cells sharing a common edge with a specific cell, etc. In some embodiments, the method may comprise the process 614 of moving the one or more nodes based at least in part upon the adjustment from 612.

In some embodiments, the process 614 moves the one or more nodes by using one or more models. In some embodiments, the method may comprise the process 616 of determining a second set of cells based at least in part upon the result of moving the one or more nodes, and the method loops back to 610 to re-determine whether the second set of cells meets the one or more convergence or stopping criteria. The method may then iterates through 610~616 until the second set of cells meets the one or more convergence or stopping criteria where the method proceed to 618 as described above.

In some embodiments, the method may optionally comprise the process 620 of constructing a graph using the nodes in the second set of cells and the conductivity information. In some embodiments, each cell is represented in the graph as a node, and an edge connecting two nodes in the graph indicates that the two cells corresponding to the two connected nodes share a common cell boundary. In some embodiments, the method may further use the graph in the force directed placement or floorplanning module 104.

Figure 7:
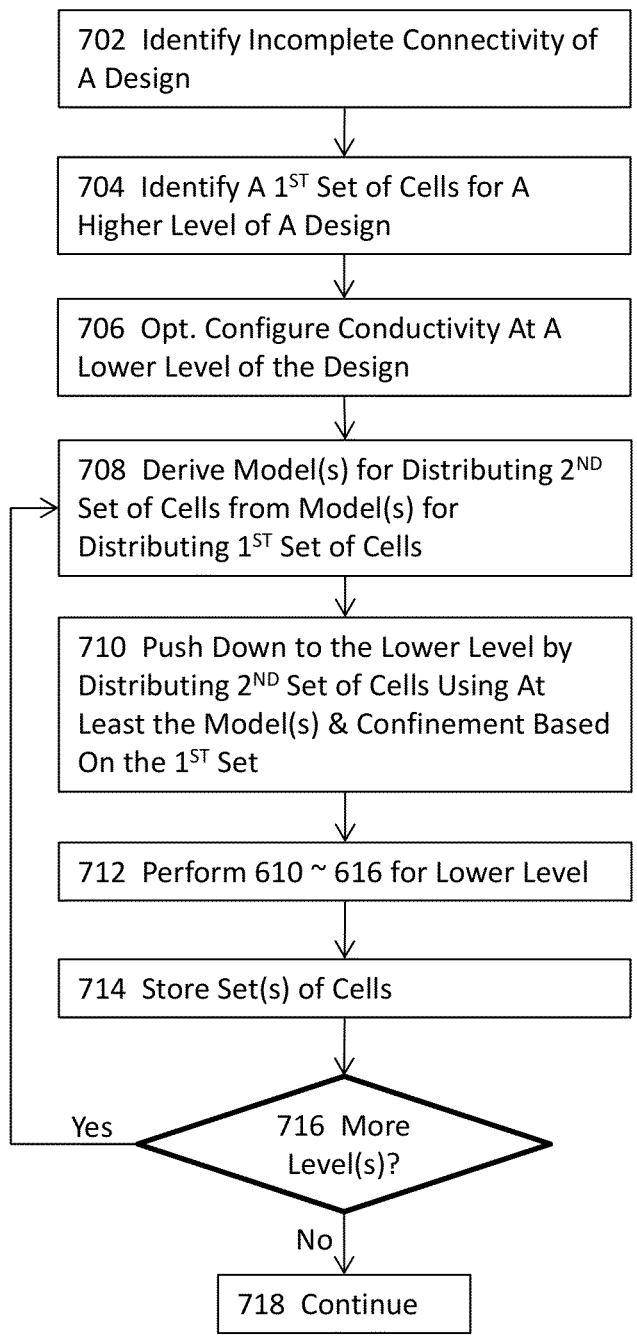
FIG. 7 illustrates a top level flow diagram for implementing multi-hierarchy physical design decomposition with custom connectivity in some embodiments.

FIG. 7 illustrates a top level flow diagram for implementing multi-hierarchy physical design decomposition with custom connectivity in some embodiments. In some embodiments, the method may comprise the process 702 of identifying incomplete conductivity information for a design such as an electronic design. The method may further include the process 704 of identifying a first set of cells at a higher hierarchical level of the design. In some embodiments, the first set of cells include a plurality of Voronoi cells. In some embodiments, the higher hierarchical level denotes the top hierarchical level of the design that includes the coarsest level of details of the designs.

In some embodiments, the method may optionally comprise the process 706 of configuring or reconfiguring conductivity for a lower hierarchical level of the design. In some of these embodiments, the process 706 may use the incomplete conductivity identified at 702 and configure or reconfigure the incomplete conductivity of the design based at least in part upon the first set of cells identified at 704. More details about configuring or reconfiguring conductivity will be described in subsequent paragraphs. In some embodiments, the method may optionally comprise the process 708 of determining or deriving one or more models for distributing the second set of cells from the corresponding one or more models used for distributing the nodes in the first set of cells at the higher hierarchical level.

In some embodiments where one or more attractive or repulsive force models are used for distributing the nodes, process 708 determines or derives the one or more attractive or repulsive force models for the lower hierarchical level from the one or more attractive or repulsive force models for the higher hierarchical level. In some embodiments, process 708 determines or derives the one or more models for the lower hierarchical level based at least in part upon the total number of nodes at the higher hierarchical level, the total number of nodes at the lower hierarchical level, or both. More details about determining or deriving one or more models for a lower hierarchical level from the corresponding one or more models for a higher hierarchical level are described in U.S. patent application Ser. No. 13/842,890 entitled "METHODS, SYSTEMS, AND ARTICLES OF MANUFACTURE FOR IMPLEMENTING PHYSICAL DESIGN USING FORCE MODELS WITH CUSTOM CONNECTIVITY", the content of which is hereby incorporated by reference in its entirety for all purposes.

In some embodiments, the method may comprise the process 710 of pushing down to the lower hierarchical level by distributing the second set of cells. In some embodiments where the one or more models are determined or derived at 708, process 710 may distribute the second set of cells by using at least the one or more models determined or derived for the lower hierarchical level. In some embodiments, process may also examine each cell at the higher hierarchical level, determine the total number of nodes at the lower hierarchical level for each cell by examining the hierarchies of the design, and distribute the total number of nodes either randomly or uniformly around the node at the higher hierarchical of each cell (where a cell contains one node) at a distance from the node.

For example, if a parent cell has a parent node at the higher hierarchical level and is to include five sub-cells at the lower hierarchical level, process 710 may, for example, identify the shortest distance from the parent node to the edges of the parent cell and distribute the five nodes of the five sub-cells along an imaginary circle having its center at the parent node and a radius of the shortest distance. In this example, the five nodes of the five sub-cells at the lower hierarchical level are confined within the parent cell and thus maintains the hierarchies of the design. In some embodiments, process may randomly distribute the child nodes in their parent cell so long as the child nodes are confined within the boundaries of the parent cell.

In some embodiments where child nodes are added to a parent cell without the requirement of having differently sized regions, the child nodes may be randomly distributed in the physical design space if one or more convergence or stopping criteria include a target area criterion. In some embodiments, the method may comprise the process 712 of performing processes 610~616 of FIG. 6 for the lower hierarchical level until the set of cells at the lower hierarchical level satisfies one or more convergence or stopping criteria. In some embodiments, the method may comprise the process 714 of storing the set(s) of cells that include the first set of cells at the higher hierarchical level or the set of cells at the lower hierarchical level. In some embodiments, the method may comprise the process 716 of determining whether the design includes another hierarchical level to be processed. If so, the method returns to process 708 and repeats the processes 708~714. If process 716 determines that all hierarchical levels of the design have been processed, the method may store set(s) of cells at 714 and proceed to 718 to continue.

Figure 8:
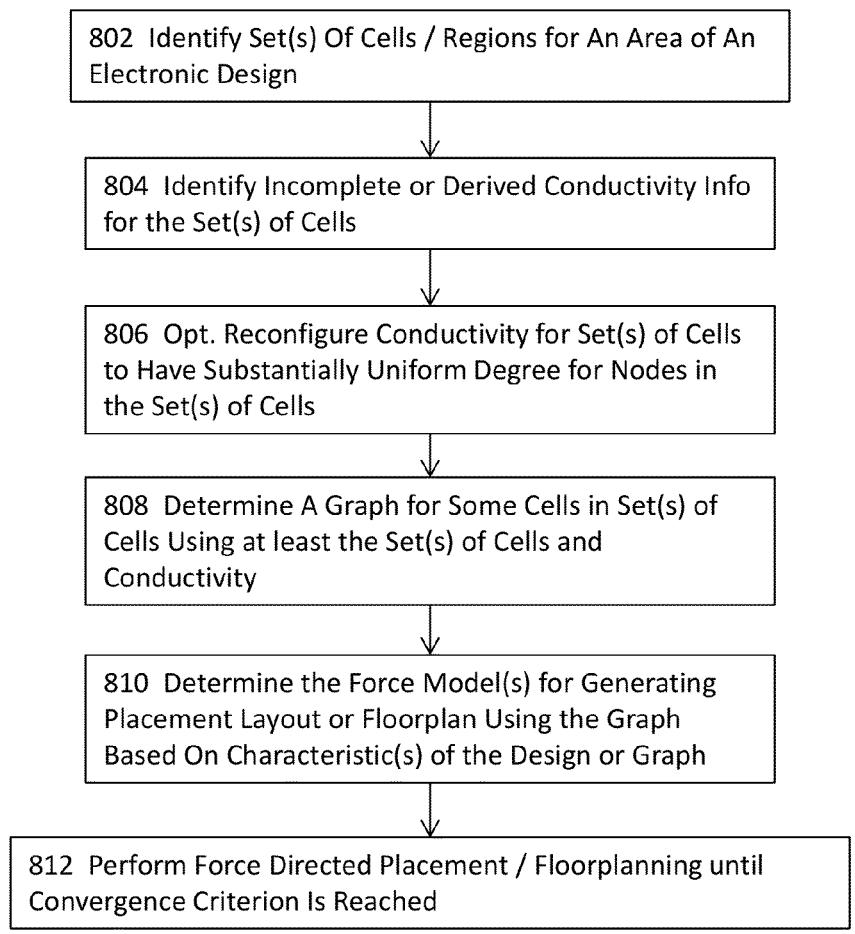
FIG. 8 illustrates more details about a top level flow diagram for implementing physical designs using force models in some embodiments.

FIG. 8 illustrates more details about a top level flow diagram for implementing physical designs using force models in some embodiments. In one or more embodiments, the method for implementing physical designs using one or more force models illustrated in FIG. 8 may comprise the process 802 of identifying one or more sets of cells for an area of interest in an electronic design. In some embodiments, the method may comprise the process 804 of identifying conductivity information for the one or more sets of cells. In some embodiments, the conductivity information identified at 804 comprises custom conductivity information or partial, incomplete conductivity information.

In some embodiments, the conductivity information may comprise derived or inferred conductivity information that is derived by using at least the one or more sets of cells identified at 802. More details about deriving or inferring conductivity information using at least one or more sets of cells representing decomposition of an electronic design are described in U.S. patent application Ser. No. 13/843,706 entitled "METHODS, SYSTEMS, AND ARTICLES OF MANUFACTURE FOR IMPLEMENTING PHYSICAL DESIGN DECOMPOSITION WITH CUSTOM CONDUCTIVITY", the content of which is hereby incorporated by reference in its entirety for all purposes.

In some embodiments, the method may optionally comprise the process 806 of configuring or reconfiguring the conductivity information for at least some cells in the one or more sets of cells to have substantially uniform degree for nodes in the one or more sets of cells. In the graph theory, the degree or valency of a vertex of a graph denotes the number of edges incident to the vertex with loops counted twice. The degree of a vertex of the graph layout constructed by, for example, process 808 also represents the number of neighboring cells of a cell, if the conductivity information has not been configured or reconfigured as described in process 806. More details about configuring or reconfiguring the conductivity information are described in U.S. patent application Ser. No. 13/843,706 entitled "METHODS, SYSTEMS, AND ARTICLES OF MANUFACTURE FOR IMPLEMENTING PHYSICAL DESIGN DECOMPOSITION WITH CUSTOM CONNECTIVITY", the content of which is hereby incorporated by reference in its entirety for all purposes.

In some embodiments, the method may comprise the process 808 of determining a graph for some cells in the one or more sets of cells using at least the one or more sets of cells and the conductivity information. In some embodiments, each cell of the some cells is represented as a vertex in the graph, and an edge between two vertices in the graph indicates that the two vertices are not only adjacent to but also interacting with each other in some embodiments. In some embodiments, the method may comprise the process 810 of determine the force model(s) for generating placement layout or floorplan using the graph based at least in part on one or more characteristics of the design or of the graph.

For example, the method may determine to use one or more attractive force models, one or more repulsive force models, a containment force model, and a cell-based force model for a user-defined, physical electronic design (e.g., the edges or nodes in a graph layout comprise user-defined elements) in some embodiments. The method may also determine to use one or more attractive force models (e.g., Voronoi attractive force model or cell attractive force model) and a containment force model for a physical electronic design that is derived by using the Voronoi-based graph layout to drive a Voronoi diagram to the target area convergence or stopping criterion in some embodiments.

The method may also determine to use one or more attractive force models (e.g., Voronoi attractive force model or cell attractive force model), one or more repulsive force models, and a containment force model for a physical electronic design that is derived by using the Voronoi-based graph layout to drive a Voronoi diagram to the target area convergence or stopping criterion in some embodiments. More details about the decomposition process are described in U.S. patent application Ser. No. 13/843,706 entitled "METHODS, SYSTEMS, AND ARTICLES OF MANUFACTURE FOR IMPLEMENTING PHYSICAL DESIGN DECOMPOSITION WITH CUSTOM CONNECTIVITY", the content of which is hereby incorporated by reference in its entirety for all purposes.

In some embodiments, the method may comprise the process 812 of performing force directed placement or floorplanning to generate a placement layout or a floorplan while maintaining the conductivity information initially identified at 804 until one or more convergence or stopping criterion are satisfied.

Figure 9:
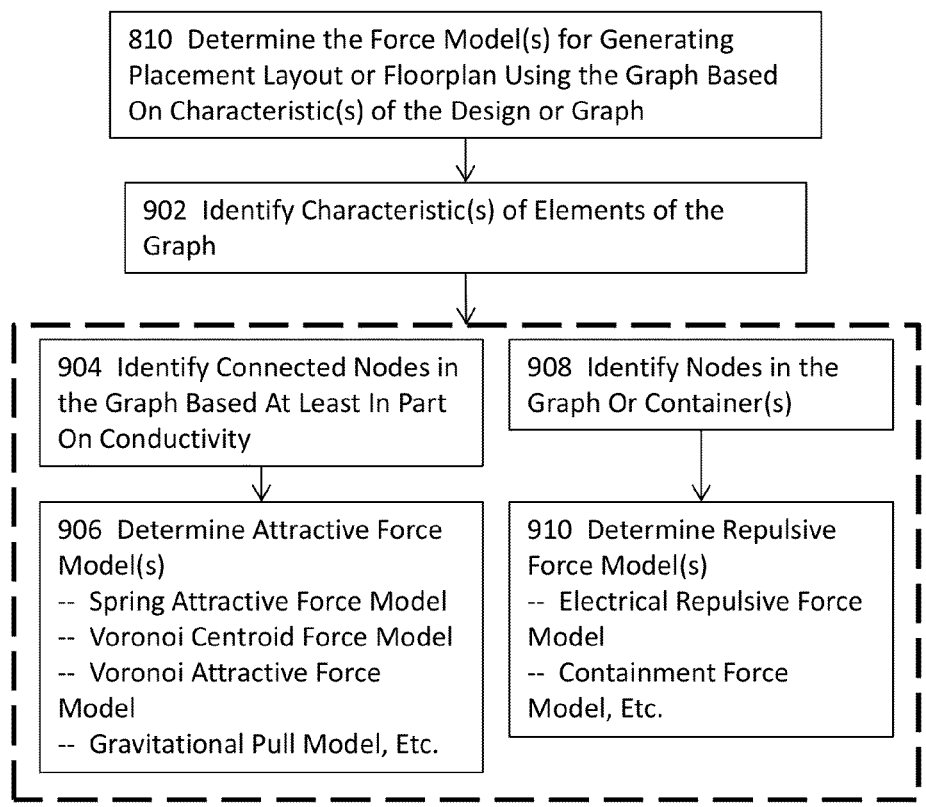
FIG. 9 illustrates more details about the top level flow diagram illustrated in FIG. 8 in some embodiments.

FIG. 9 illustrates more details about the top level flow diagram illustrated in FIG. 8 in some embodiments. More specifically, FIG. 9 illustrates more details about process 810 of FIG. 8. In some embodiments, process 810 may comprise the process 902 of identifying one or more characteristics of the elements of the graph. For example, process 902 may identify how an area of interest in the physical design space of an electronic design is partitioned or what kind of decomposition algorithms are used to decompose the area of interest.

In some embodiments, process 810 may comprise the process 904 of identifying connected nodes in the graph based at least in part on the conductivity information. In some embodiments where Voronoi decomposition is used to partition a design, all nodes of neighboring Voronoi cells may be potentially connected. Nonetheless, the method may present an option to the user to remove specific connectivity between two nodes in order to achieve a substantially uniform degree for the graph consisting of the vertices (representing the Voronoi cells) and edges (representing the connectivity). Therefore, the method may optionally identify the connected nodes at 904 in some embodiments.

In some embodiments, process 810 may comprise the process 906 of determining one or more attractive force models. The one or more attractive force models may include, for example but not limited to, a spring attractive force model, a cell-based force model (e.g., a Voronoi centroid force model), a Voronoi attractive force model, a gravitational pull force model, or combinations thereof, etc. More details about the force models will be described in subsequent paragraphs with reference to appropriate drawing figures. In some embodiments, process 810 may comprise the process 908 of identifying nodes in the graph for modeling the one or more repulsive force models. In some embodiments, process 810 may comprise the process 910 of determining one or more repulsive force models. The one or more repulsive force models may include, for example but not limited to, an electrical repulsive force model, a containment force model, or combinations thereof, etc.

Figure 10:
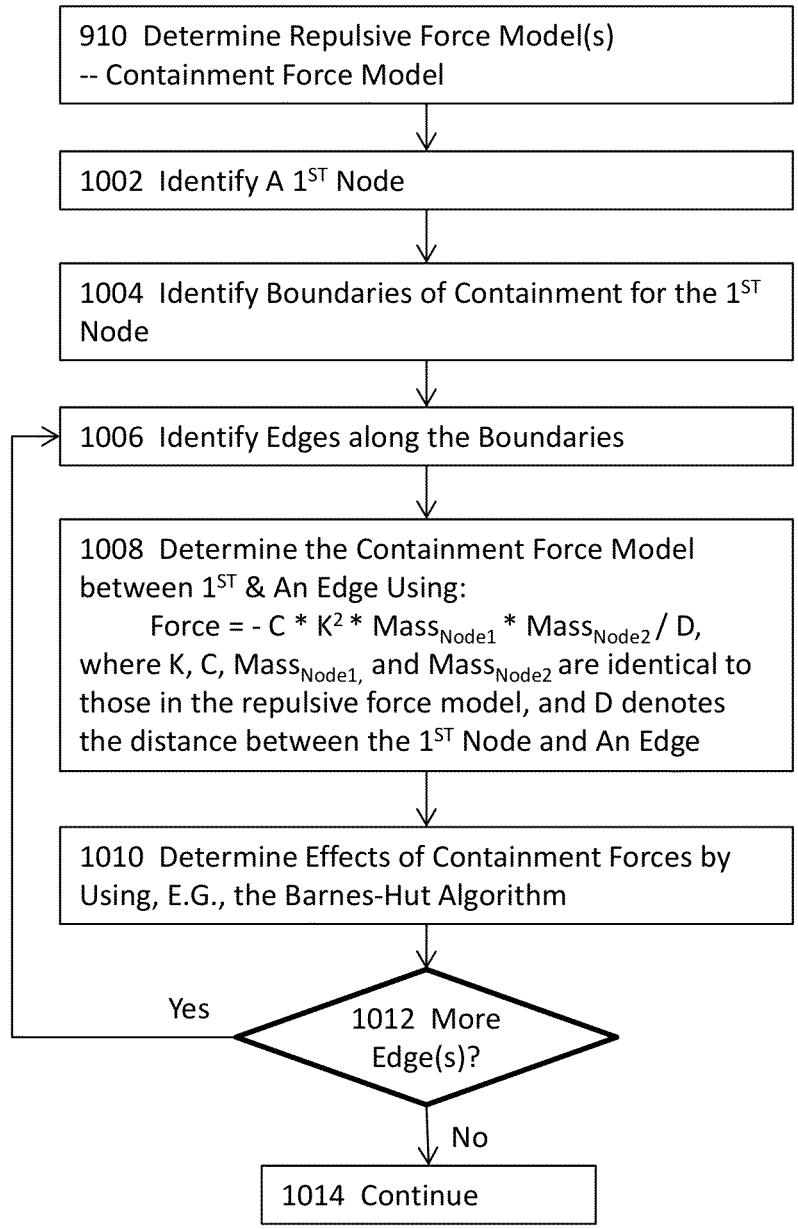
FIG. 10 illustrates more details about the top level flow diagram illustrated in FIG. 9 in some embodiments.

FIG. 10 illustrates more details about the top level flow diagram illustrated in FIG. 9 in some embodiments. More specifically, FIG. 10 illustrates the process 910 for determining the containment force model in some embodiments. The containment force is repulsive in nature to keep a graph contained within a boundary of the containment and thus follows a substantially similar form as the electrical repulsive force in some embodiments. A container may thus include, for example but not limited to the entire chip, an IO, or any physical entity within which a node needs to be confined in an electronic design in some embodiments, and thus the boundary may comprise the boundary of the entire chip, the boundary of an IO, or the boundary of any physical entity in these embodiments.

In some embodiments, various methods described herein may use one or more containers to implement the graph layout at the global level, while simultaneously enforcing physical grouping requirements. In some embodiments, the process 910 may include the process 1002 of identifying a first node from a set of nodes such as but not limited to the Voronoi generation nodes that are used to generate a plurality of Voronoi cells for a physical design space of an electronic design.

In some embodiments, the process 910 may include the process 1004 of identifying boundaries of the containment for the first node. Any physical entity in the physical design (e.g., a cell, a pin, a terminal, etc.) may be used as the containment in these embodiments. In some embodiments, process 1004 uses an IO cell in an IO area of an electronic design as the containment and identifies the boundaries of the IO cell at 1004. In some embodiments, the process 910 may include the process 1006 of identifying one or more second nodes along each edge of some or all edges along the boundary of the containment. In some embodiments, process 1006 considers all edges of a container in determining the containment force model. In some embodiments, process 1006 identifies some but not all of the edges of a container in determining the containment force model. For example, process 1006 may identify four edges that are substantially, approximately, or roughly equally distributed around the first node within the container in the angular direction and then identify one or more second nodes for each of the four edges. In some embodiments, process 1006 identifies the entire edge, which is a collection of infinite number of points, for the determination of the containment force model.

In some embodiments, the process 910 may include the process 1008 of determining the containment force model between first node and the edge identified at 1006 by using at least the following formula:

Force=$-C*K^2*Mass_{Node1}*Mass_{Node2}/D$, where K, C, $Mass_{Node1}$, and $Mass_{Node2}$ are identical to those in the repulsive force model, and D denotes the distance between the first node and the identified edge. In these embodiments, the containment force model models the force exerted by the edges of a node's container in a vector form that acts on the node.

In some embodiments, both the $Mass_{Node1}$ and $Mass_{Node2}$ are identical (e.g., both having a value of 1.0). In some embodiments, the value of $Mass_{Node1}$ is different from that of $Mass_{Node2}$. In some embodiments, the mass of the first node ($Mass_{Node1}$) used in the containment force model may be different from the mass of the same first node used in the repulsive force model (e.g., the electrical repulsive force model). In some embodiments, the mass of the second node depends on the length of the edge on which the second nodes is located. For example, the mass of the second node may be proportional to the length of the edge on which the second node is located. In some embodiments where process 1006 identifies more than one second node, process 1008 determines, for each identified second node, the distance (D in the above formula) between the first node and the second node and then determines the resultant force by using vector mathematics. In some embodiments where process 1006 identifies the entire edge, process 1008 integrates the force between a second node on the edge and the first node over the entire edge to determine the resultant force. In some embodiments, the process 910 may include the process 1012 of determining whether there is another edge to process. If so, the method returns to 1006 and repeats processes 1006~1012 until all edges have been processed. Otherwise, the method proceeds to 1014 to continue with, for example, storing the force model.

Figure 11A:
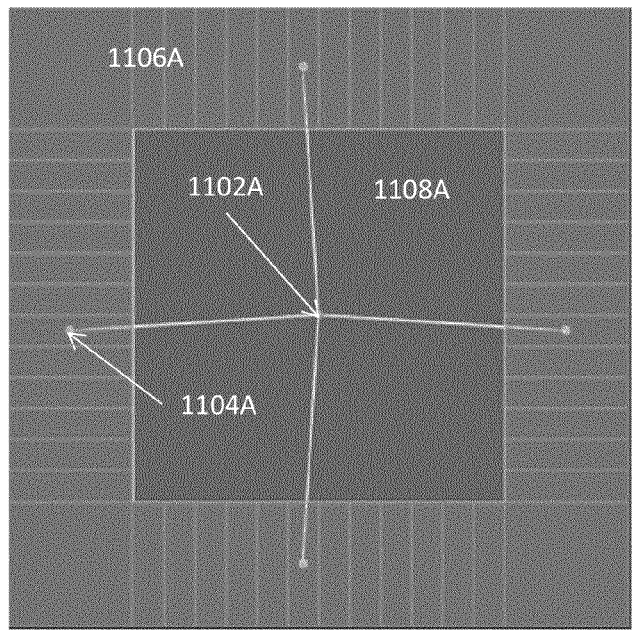
FIGS. 11A-N illustrate the generation of an exemplary floorplan or a placement layout during the implementation of the corresponding physical design using one or more force models operating on sets of cells representing the a physical design space of the physical design in some embodiments.
Figure 11B:
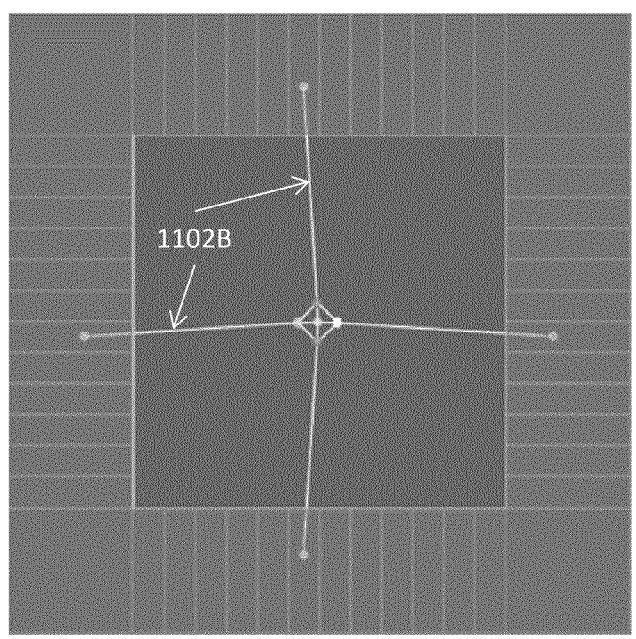
Figure 11C:
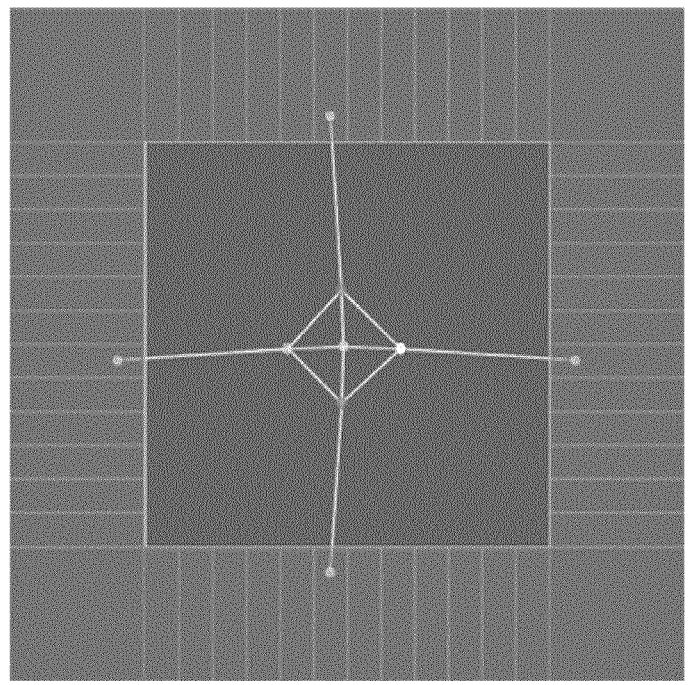
Figure 11D:
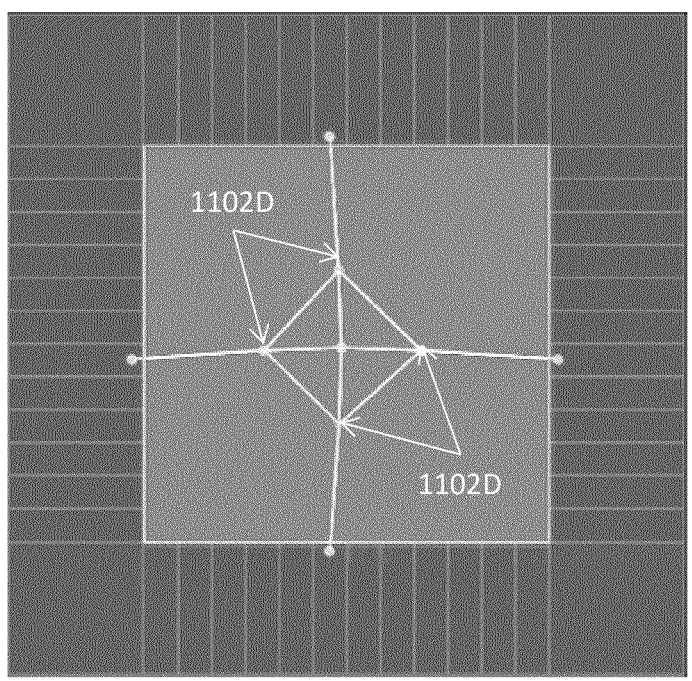
Figure 11E:
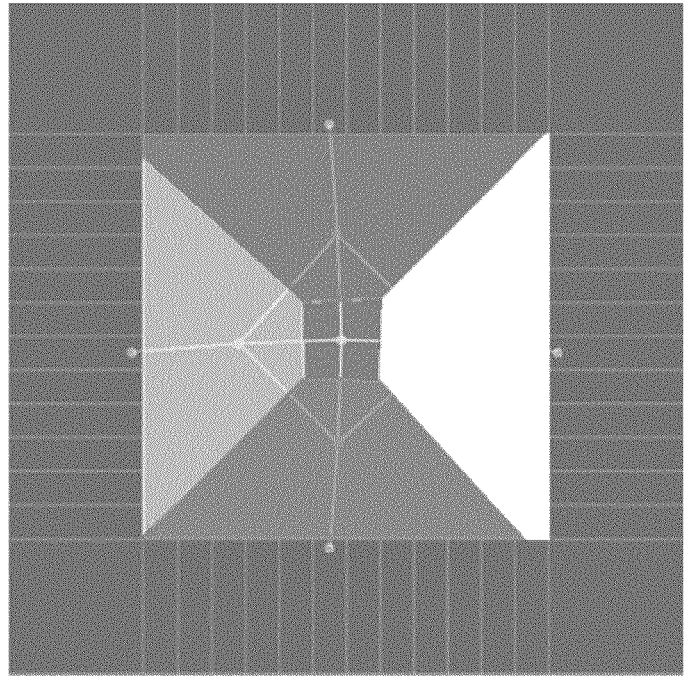
Figure 11F:
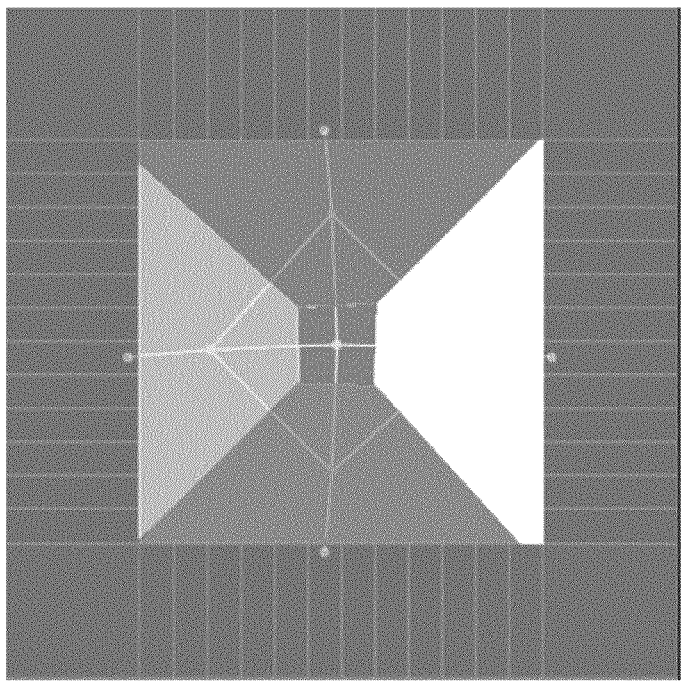
Figure 11G:
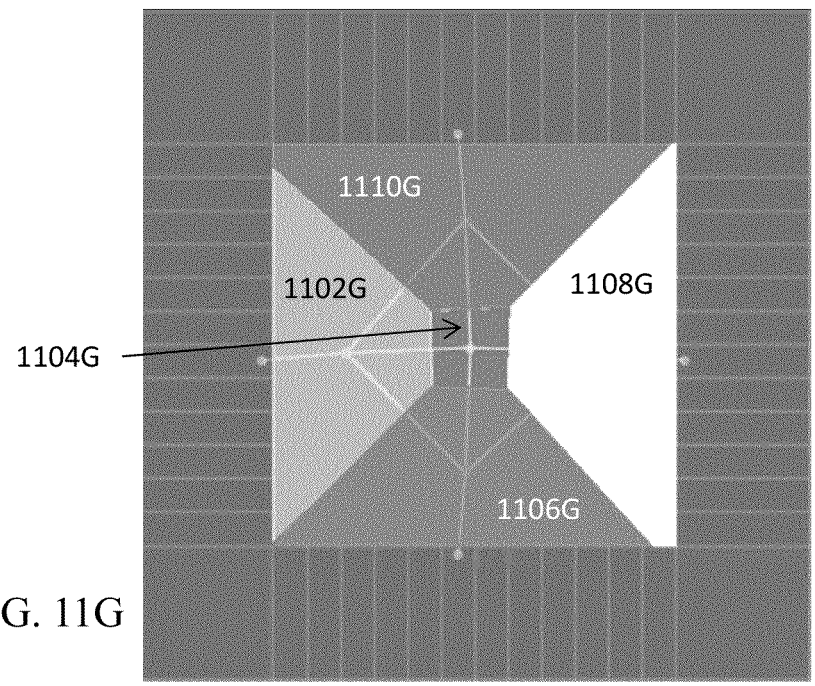
Figure 11H:
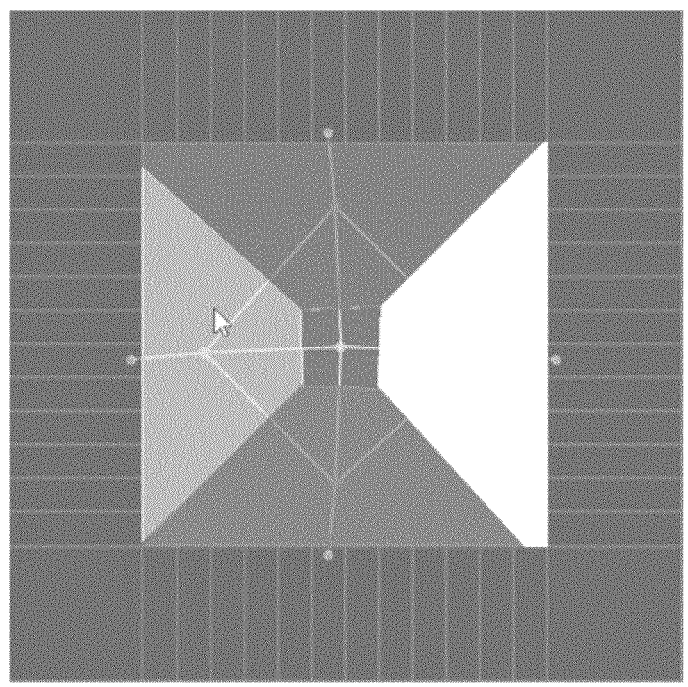
Figure 11I:
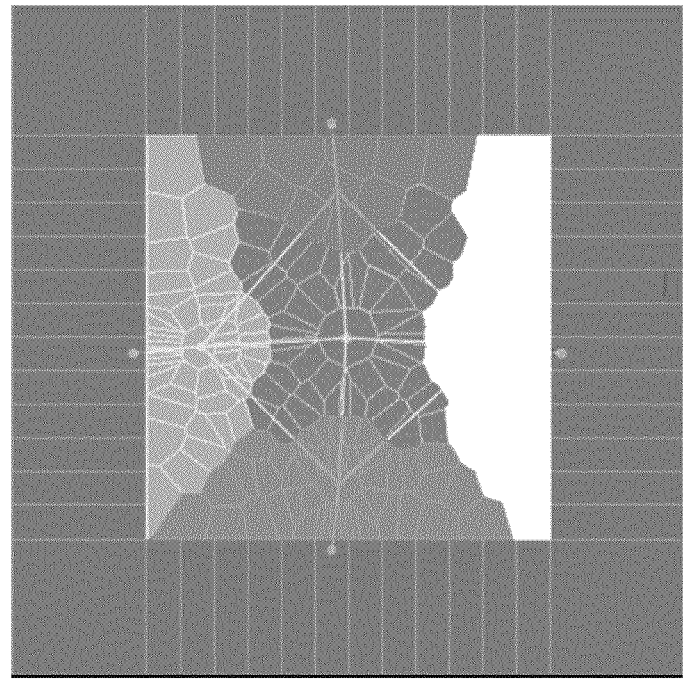
Figure 11J:
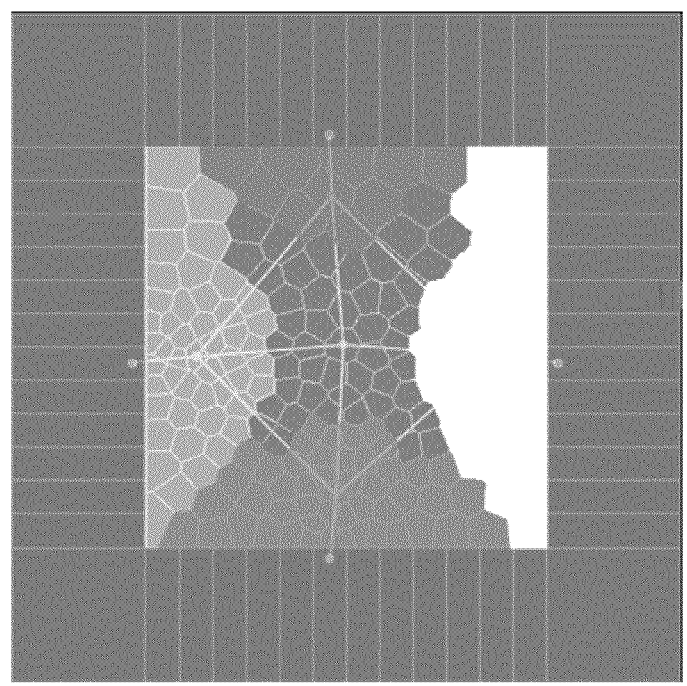
Figure 11K:
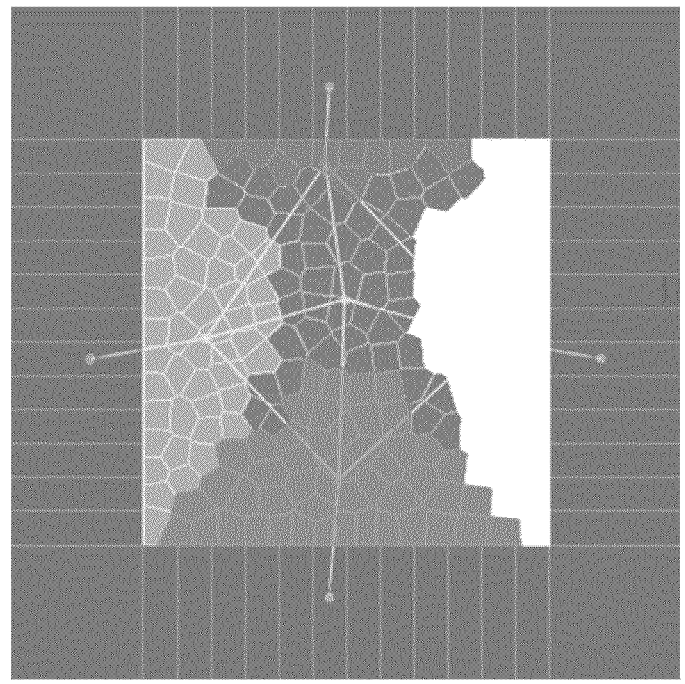
Figure 11L:
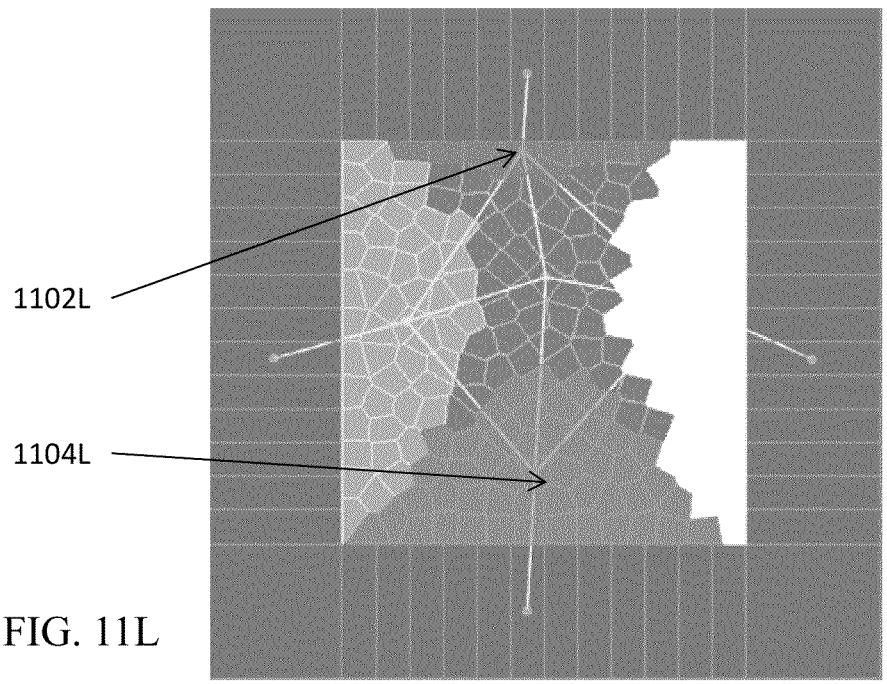
Figure 11M:
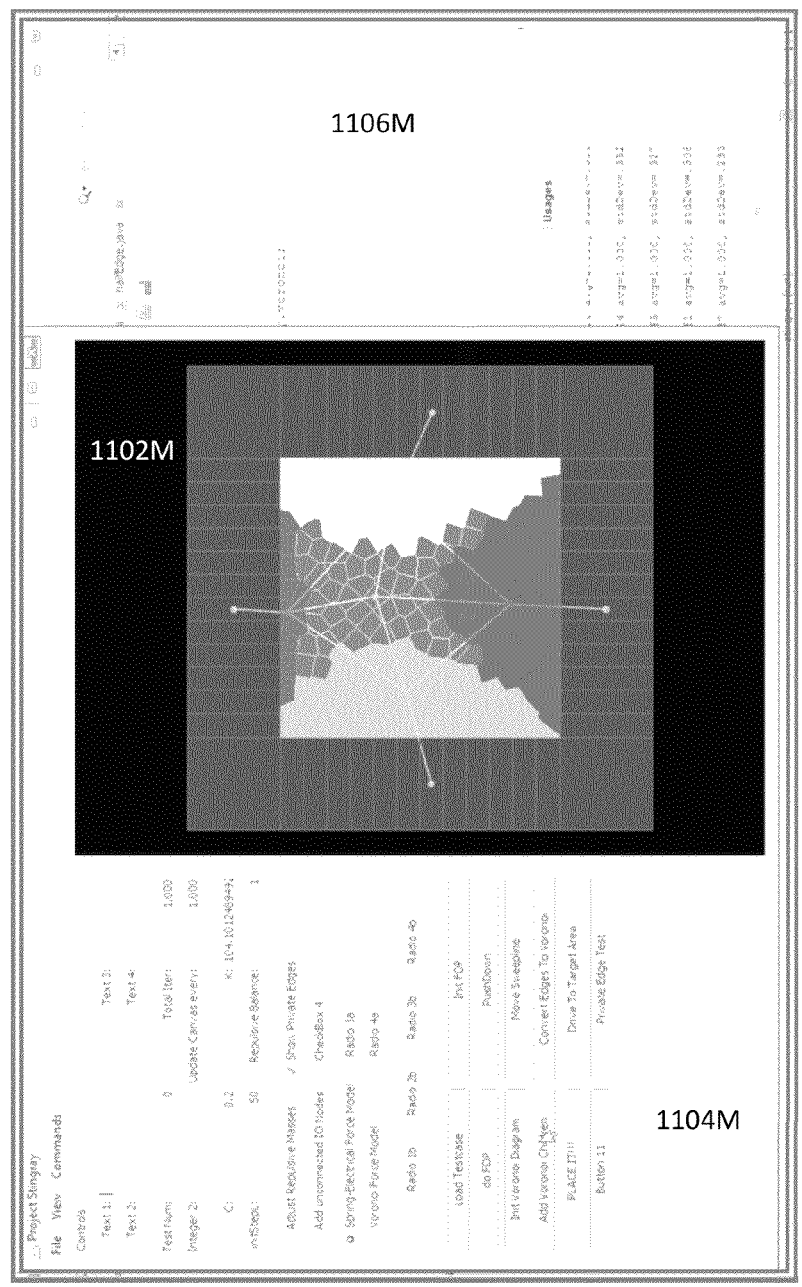
Figure 11N:
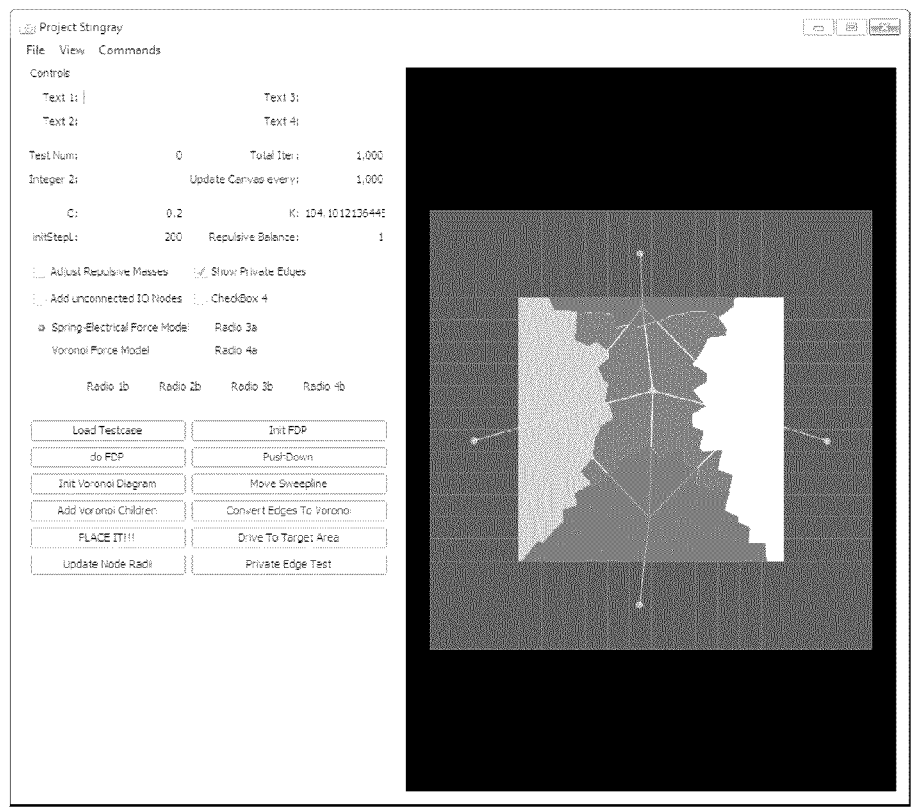

FIGS. 11A-N illustrate the generation of an exemplary floorplan or a placement layout during the implementation of the corresponding physical design using one or more force models operating on sets of cells representing the a physical design space of the physical design in some embodiments. FIG. 11A illustrates an electronic design with a core area 1108A and an IO area 1106A. The electronic design is associated with a custom conductivity information (e.g., user-specified conductivity) that requires that node 1102A communicate with four other nodes (1104A) in the IO area 1106A. Moreover, FIG. 11A illustrates the design is subject to a custom conductivity (e.g., user specified conductivity) that connects node 1102A to the four nodes (1104A, 4X) in the IO area 1106A.

FIGS. 11B-D shows how the nodes (e.g., 1102D in FIG. 11D) are continuously moved by using one or more force models described herein until one or more criteria (e.g., a minimum potential energy level) are satisfied. It shall be noted that the conductivity is maintained during the performance of the force directed placement or floorplanning process. In addition, the core area (e.g., 1108A in FIG. 11A) has not been partitioned in FIG. 11A-D; therefore, some embodiments may use, for example, the spring attractive force model and the electrical repulsive force model together with the containment force model to drive the nodes (e.g., 1102D in FIG. 11D) while maintaining the custom conductivity.

FIGS. 11E-H illustrate the generation of the Voronoi cells by using the five nodes (1102D in FIG. 11D and 1102A in FIG. 11A). FIGS. 11E-H further illustrate the four nodes in the cells, for example, 1102G, 1106G, 1108G, and 1110G are moved as the Voronoi cells are generated by using some force models that are determined based at least in part upon certain cell characteristics (e.g., cell-based attractive force model, etc.) The generation of the Voronoi cells may cause changes in some force models that are determined based at least in part upon some cell characteristics. Such changes in those force models may further move the five Voronoi generation nodes and thus in turn cause changes in the generated Voronoi cells. As described above, various embodiments iteratively apply one or more force models and the Voronoi decomposition models until one or more convergence criteria are satisfied. It shall be noted that the one or more convergence or stopping criteria do not include the target area criterion in FIGS. 11A-G, and thus the five cells exhibit different sizes.

FIGS. 11I-L illustrates decomposing a larger Voronoi cell into a plurality of smaller Voronoi cells where each of the five larger Voronoi cells (e.g., 1102G, 1106G, 1108G, and 1110G) is further represented by a plurality of Voronoi cells. It shall be noted that FIGS. 11K-L illustrate the result of applying the size constraint that requires the area of region 1102L be approximately one-fifth (⅕) of any of the other four regions. As it may be seen from FIG. 11K, approximately five times as many nodes are introduced in region 4104L than in region 1102L and iteratively performs the Voronoi decomposition with, for example, one or more force models described herein. FIGS. 11K-L illustrate the final Voronoi decomposition of the core area in which region 1102L has approximately one-fifth (⅕) the size of region 1104L. It shall be noted that the conductivity, as specified in FIG. 11A, is nonetheless maintained throughout the entire process from FIG. 11A to FIG. 11L.

FIGS. 11M-N illustrate an exemplary user interface with a design window 1102M showing the finished physical implementation shown in FIG. 11L. The content of window 1102M is continuously refreshed to reflect the nodal locations, the generated floorplan or placement layout, and the custom conductivity in some embodiments. In some embodiments, the user interface may provide visual, textual, or both visual and textual representation of the state of the physical implementation in substantially real-time.

It shall be noted that the term substantially is used to reflect the fact that every computation requires some time to complete, and that rendering the computational result also requires some time to complete, regardless of how fast the computing system performing these tasks is. The window 1102M may also show or hide the boundaries of individual Voronoi cells in some embodiments. The user interface may provide the user with the capability of showing various types of design related information in various forms depending on the user's input in some embodiments.

For example, the user interface may provide configurable information of a cell (e.g., cell area, deviation from target, conductivity, etc.) when the user manipulates an input device (e.g., a pointing device) to hover around the cell. As another example, the user interface may show, depending on the user's choice in configurations or settings, which cells are deviating more from the one or more convergence criteria in some embodiments. In some embodiments, the user interface may, depending on the user's choice in configurations or settings, use multiple different colors or a thermal map to indicate which portions of the design exhibit higher errors, and which portions exhibit lower errors.

The user interface may further include a control panel 1104M that provides various controls to a user. For example, the control panel 1104M may allow a user to identify one or more cells or one or more nodes thereof and to modify (e.g., add, remove, change, infer, anchor, etc.) conductivity for the identified cells or nodes, to modify (e.g., add, remove, group, anchor, etc.) the nodes or cells, or to adjust various parameters, coefficients, constants, etc. in, for example, one or more force models or the decomposition algorithm in some embodiments. The control panel 1104M may also provide the user with the capability to specify, identify, or determine one or more convergence or stopping criteria in some embodiments.

The control panel may also provide context-based hints, recommendations, or help to the user depending on what the system is performing at a given instant, on what the user inputs into the system, or on receiving a request by the user in some embodiments. The user interface may also provide a separate display area 1106M to show various types of more detailed information such as but not limited to the geometric information, errors, or any other information of a cell, a node, etc. of the design in the window 1102M. FIG. 11N illustrates the same final floorplan or placement layout as FIG. 11M, but the boundaries of individual Voronoi cells have been suppressed.

Figure 12A:
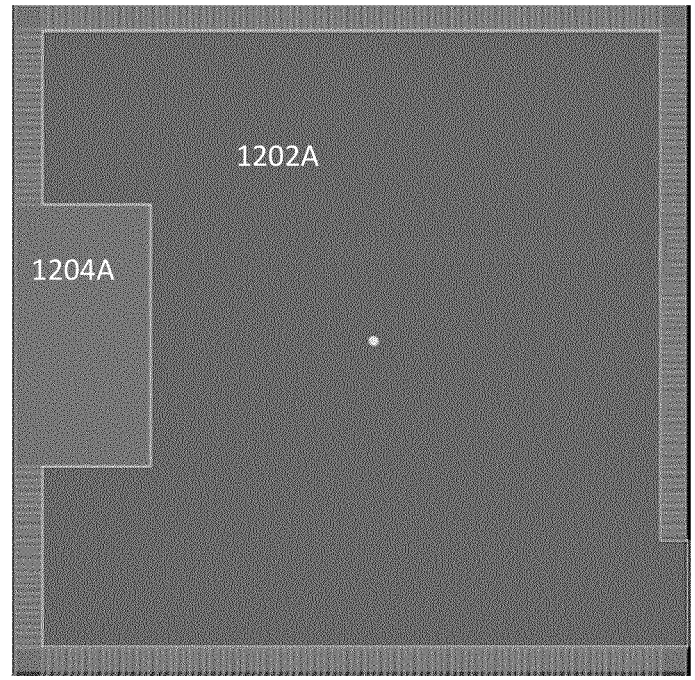
FIGS. 12A-P illustrate how the exemplary physical design decomposition evolves using the some of the processes described herein in some embodiments.
Figure 12B:
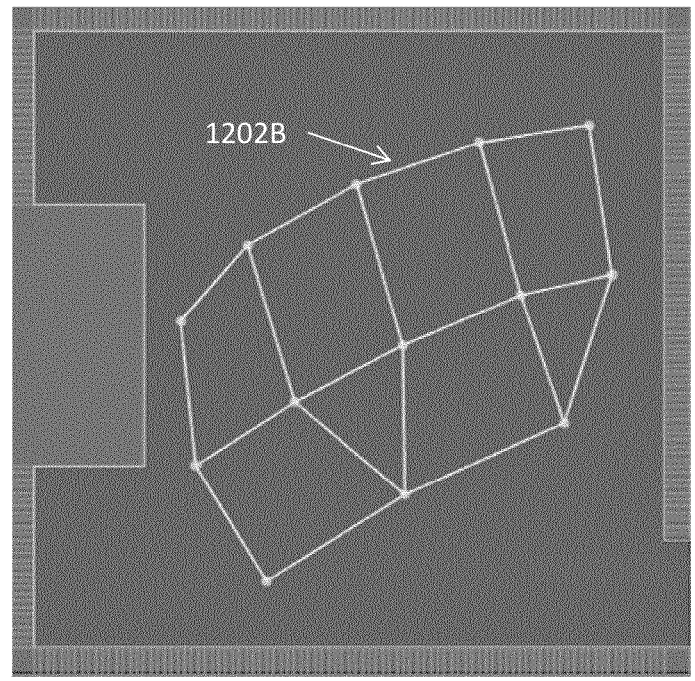
Figure 12C:
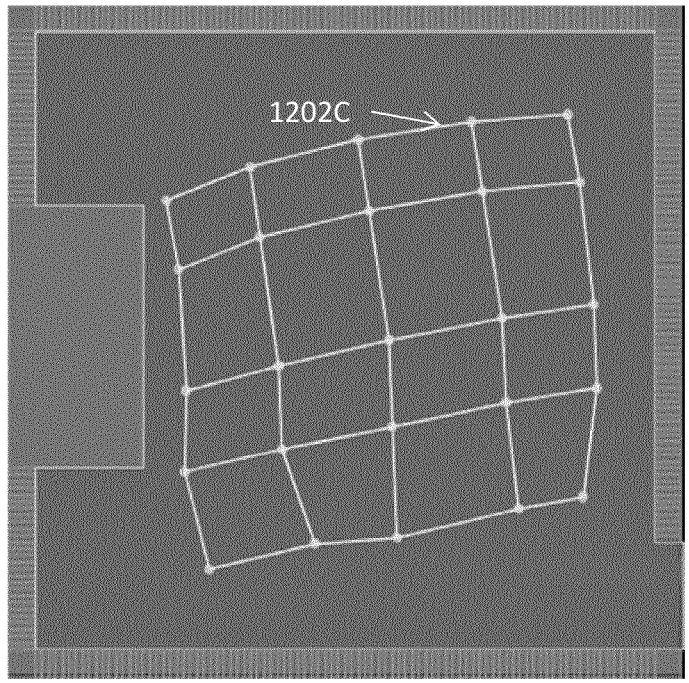
Figure 12D:
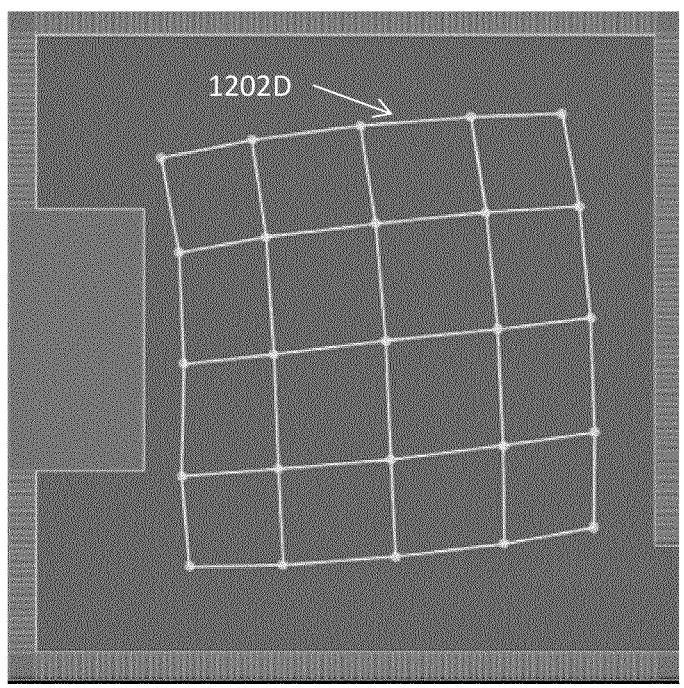
Figure 12E:
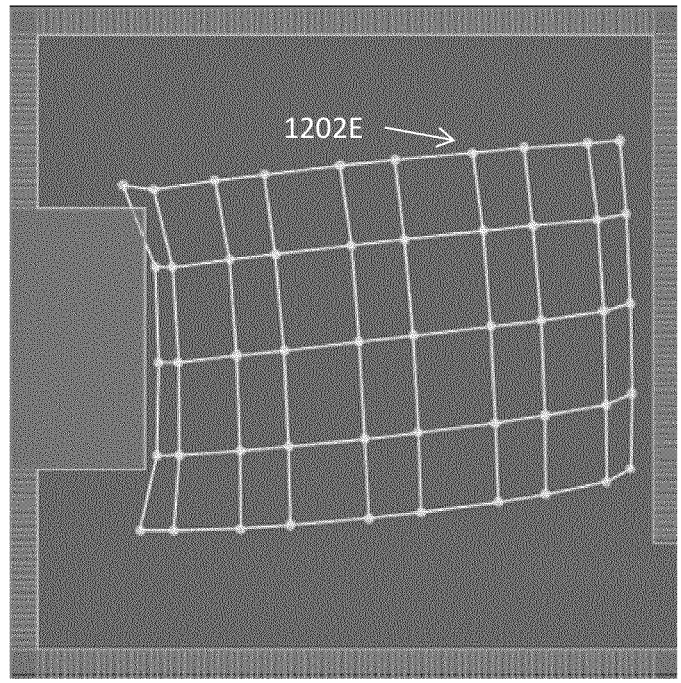
Figure 12F:
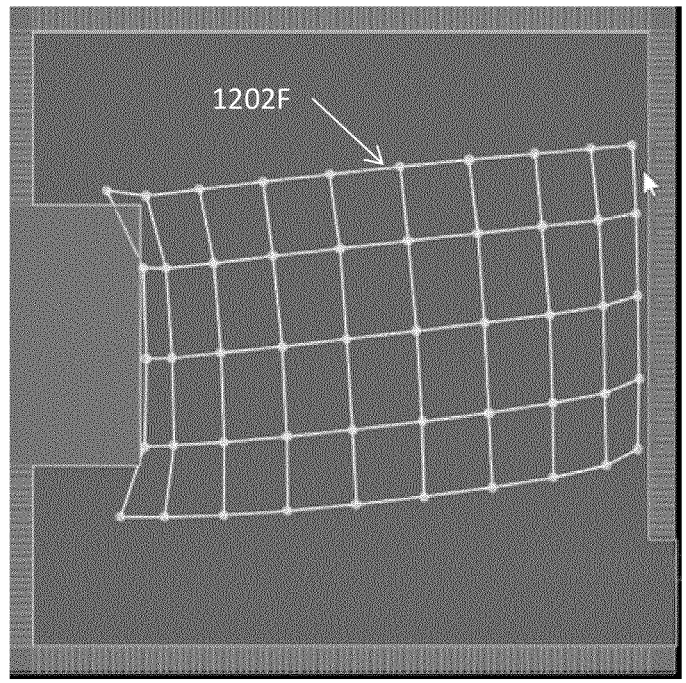
Figure 12G:
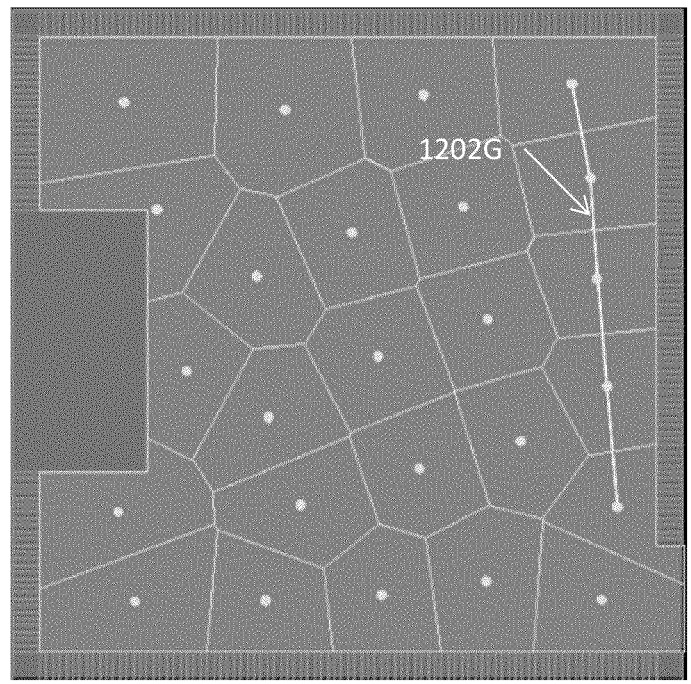
Figure 12H:
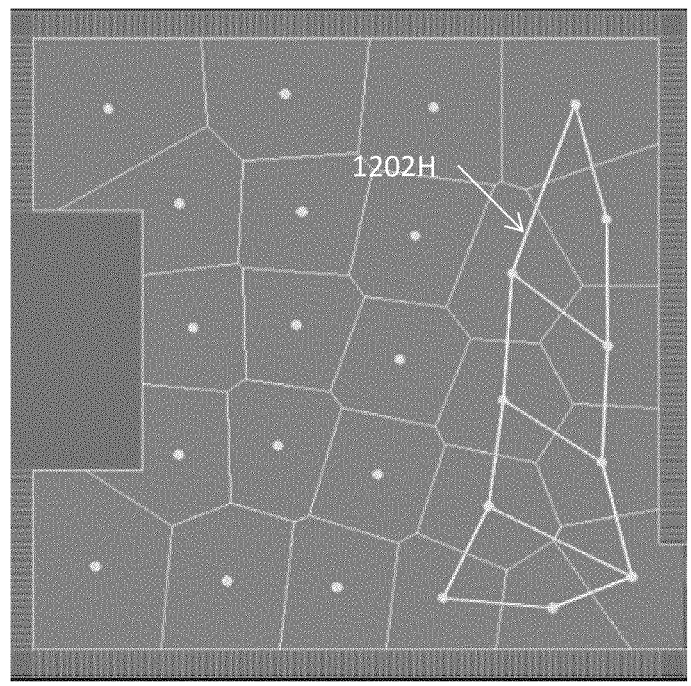
Figure 12I:
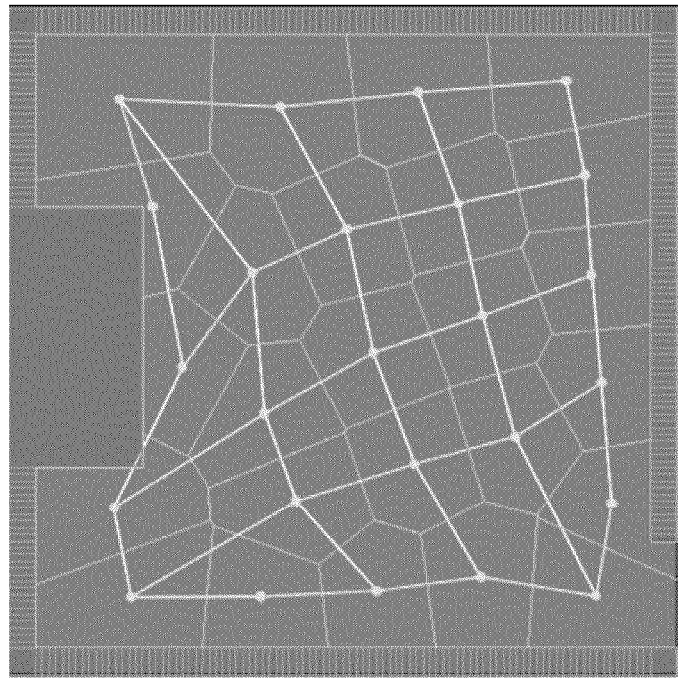
Figure 12J:
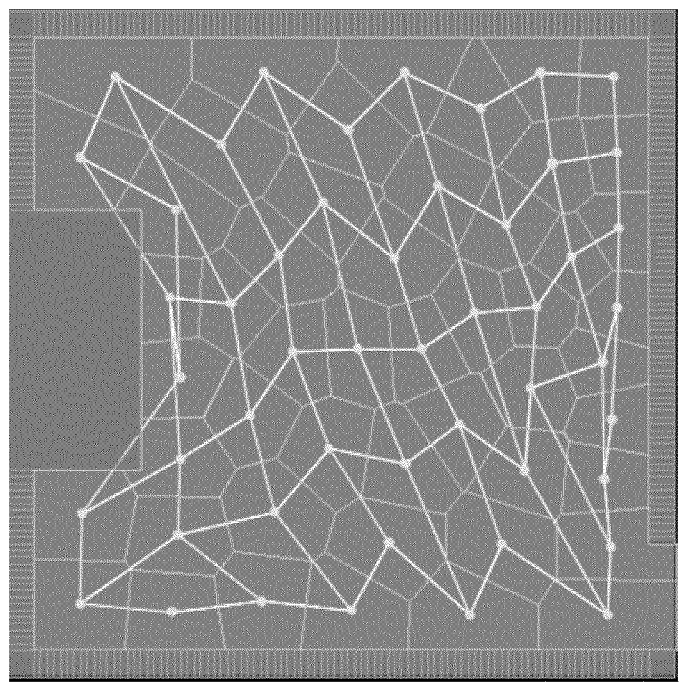
Figure 12K:
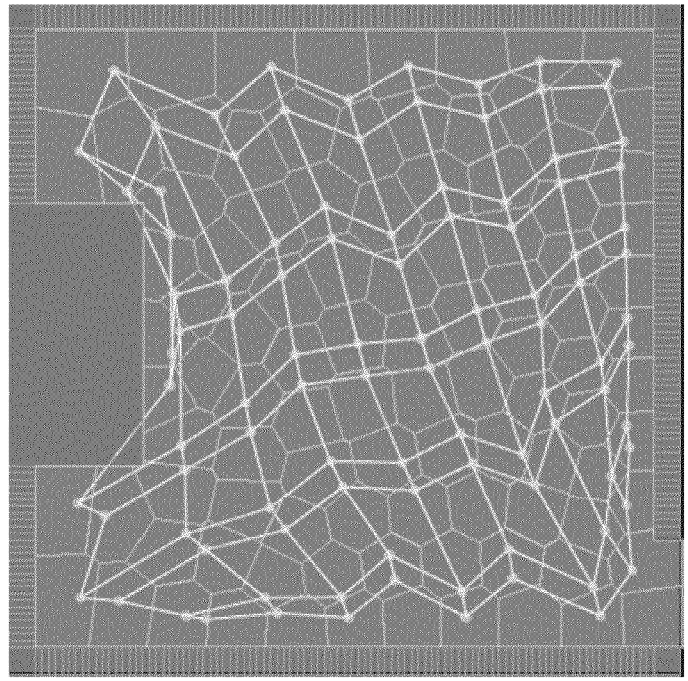
Figure 12L:
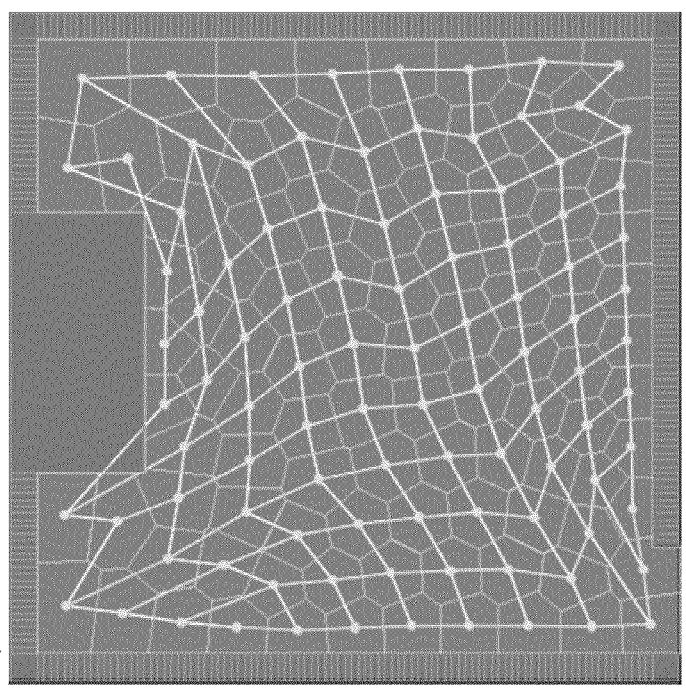
Figure 12M:
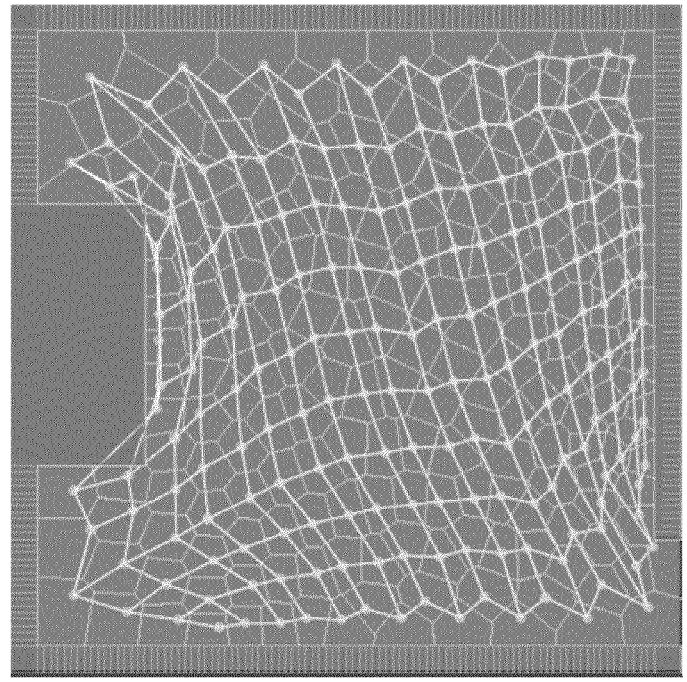
Figure 12N:
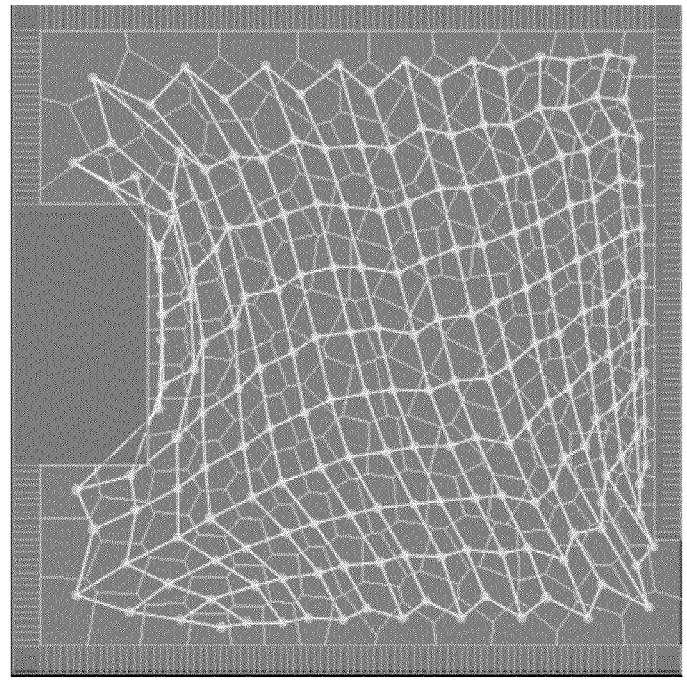
Figure 12O:
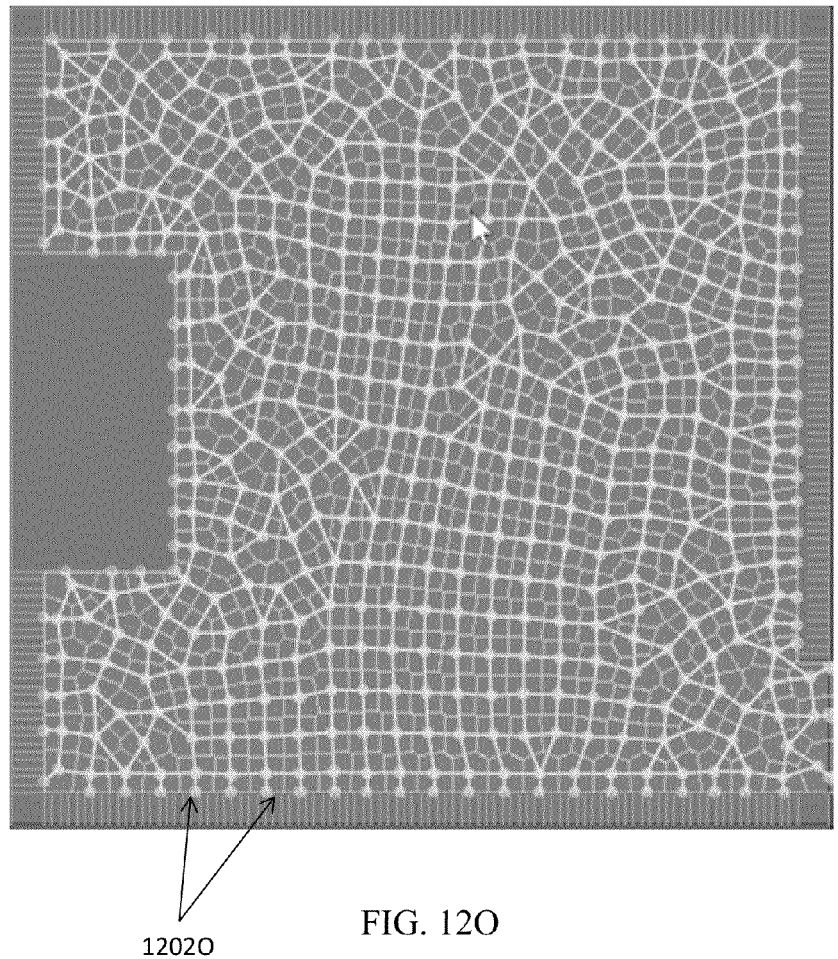
Figure 12P:
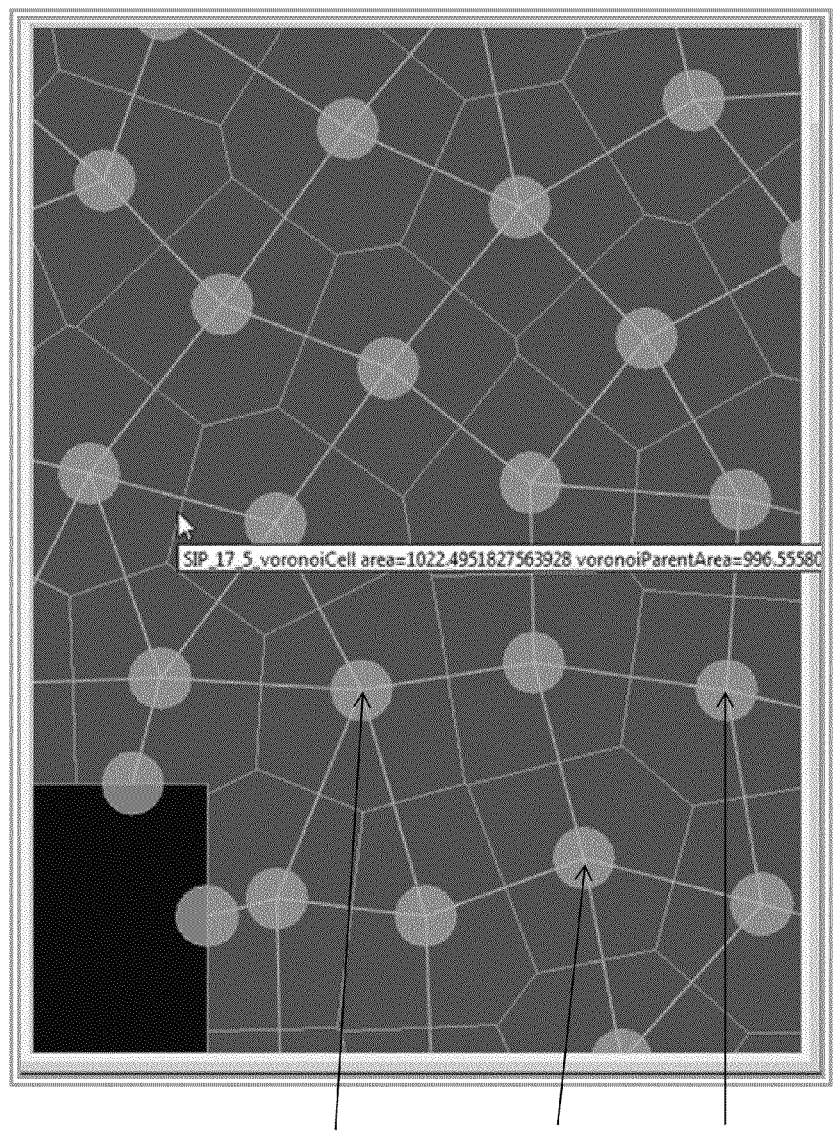

FIGS. 12A-P illustrate how the exemplary physical design decomposition evolves using the some of the processes described herein in some embodiments. More specifically, FIGS. 12A-B illustrates the initial physical design space including the core area 1202A and the IO area 1204A that substantially surrounds the core area 1202A. 1202B represents the decomposition of the core area into a 4×2 grid.

FIGS. 12C-D illustrate how the initial 4×2 grid gradually evolves into a 4×4 grid (1202C in FIG. 12C and 1202D in FIG. 12D) at a lower hierarchical level by pushing down from the higher hierarchical level of FIGS. 12A-B to the lower hierarchical level of FIGS. 12C-D.

FIGS. 12E-F shows the continuous evolution of the decomposition of the core area by pushing down to another lower hierarchical level having the 10×5 grid (1202E and 1202F). FIGS. 12G-H illustrate the evolving Voronoi decomposition of the core area where the Voronoi cells are driven to a target area, and the edges 1202G and 1202H respectively represent the conductivity (e.g., user specified conductivity) and the reconfigured conductivity in which the nodes exhibit degrees of 2 or 3 in 1202H.

FIGS. 12I-J illustrate the intermediate versions of the layout with the nodes of the Voronoi cells and how the Voronoi cells continue to change by moving the nodes (e.g., by using a force directed placement model). These two figures further illustrate that the initial, user-specified conductivity collapsed during the initial Voronoi decomposition into multiple hierarchical levels. In these embodiments, the term "collapse" indicates the process of iteratively reducing a graph having multiple nodes and some connectivity into multiple hierarchical levels by at least merging or collapsing edges that connect nodes that may be grouped at the next higher hierarchical level in some embodiments. In some of these embodiments, the nodes on both ends of an edge are merged into a single parent node when the edge collapses. In some other embodiments, nodes that share some characteristics that indicate it may be needed or desirable to physically group these nodes but do not necessarily connected by an edge may also be merged into a single parent node at a higher hierarchical level. In some embodiments, these characteristics may include, for example but not limited to, the presence of certain nodes in the same module of a logical design hierarchy, or the connection to the same clock domain, etc. FIGS. 12K-N illustrates further pushing down to even lower hierarchical levels, moving the nodes of the Voronoi cells, re-performing the Voronoi decomposition based on the moved nodes, and inferring or reconfiguring the conductivity among the Voronoi cells.

FIG. 12O illustrates the final Voronoi decomposition of the core area. FIG. 12O further illustrates anchoring (1202O) some Voronoi cells at the edges of the core area to some IO cells in the IO area. In the example illustrated in FIG. 12P, node 1202P exhibits a degree of five if all conductivity is to be considered. The method may reconfigure the conductivity for the cell corresponding to node 1202P to have the uniform degree of four by substantially uniformly distributing the degree in the angular direction around node 1202P. As a result of reconfiguring the conductivity, node 1202P is exhibiting a degree of four where the conductivity between node 1202P and node 1204P is not present. It shall be noted that it is optional to reconfigure the conductivity, and thus FIG. 12P still shows that some nodes (e.g., node 1206P showing a degree of five) are still exhibiting some non-uniform degree(s).

Figure 13A:
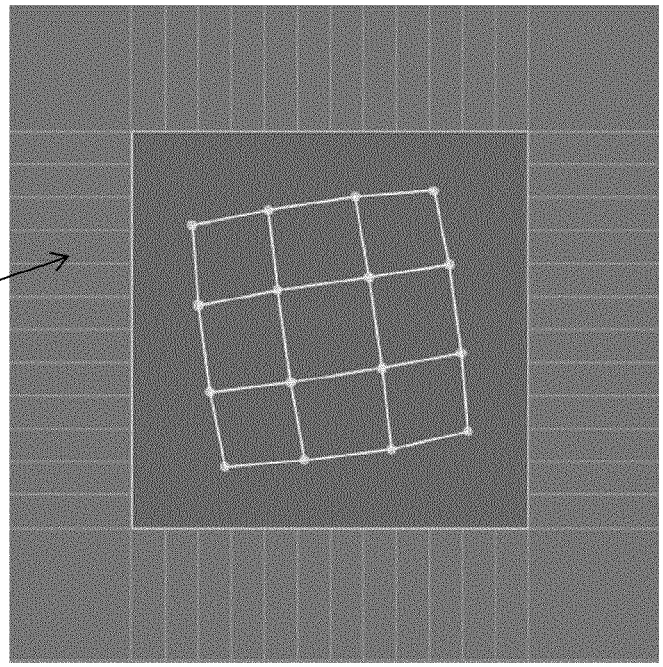
FIGS. 13A-E illustrate the generation of another exemplary floorplan or a placement layout during the implementation of the corresponding physical design using one or more force models operating on sets of cells representing the a physical design space of the physical design in some embodiments.
Figure 13B:
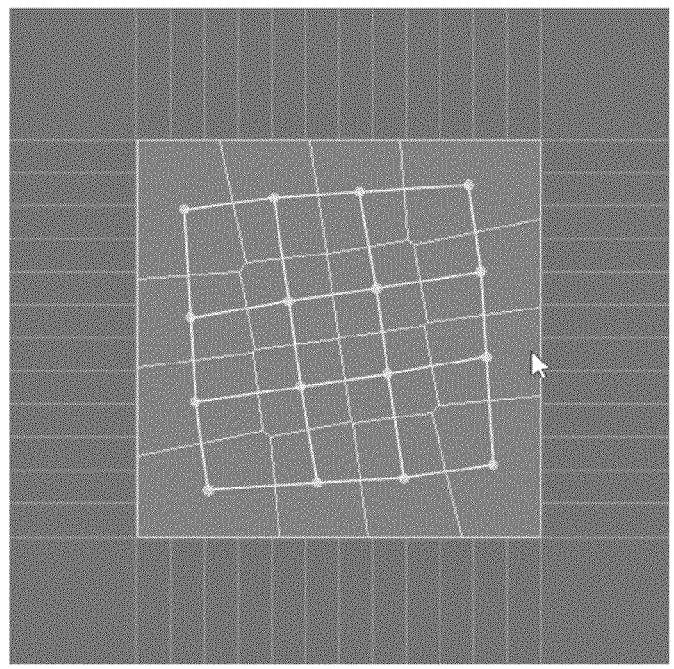

FIG. 13A-D illustrate the generation of another exemplary floorplan or a placement layout during the implementation of the corresponding physical design using one or more force models operating on sets of cells representing the a physical design space of the physical design in some embodiments. FIG. 13A illustrates the graph layout of a 4×4 grid having 16 nodes. FIG. 13B illustrates the generated Voronoi cells based on the 16 Voronoi generation nodes. It shall be noted that neither the vertices in either the graph layout of FIG. 13A nor the nodes in FIG. 13B are connected to any of the IO cells (e.g., 1302A.)

Figure 13C:
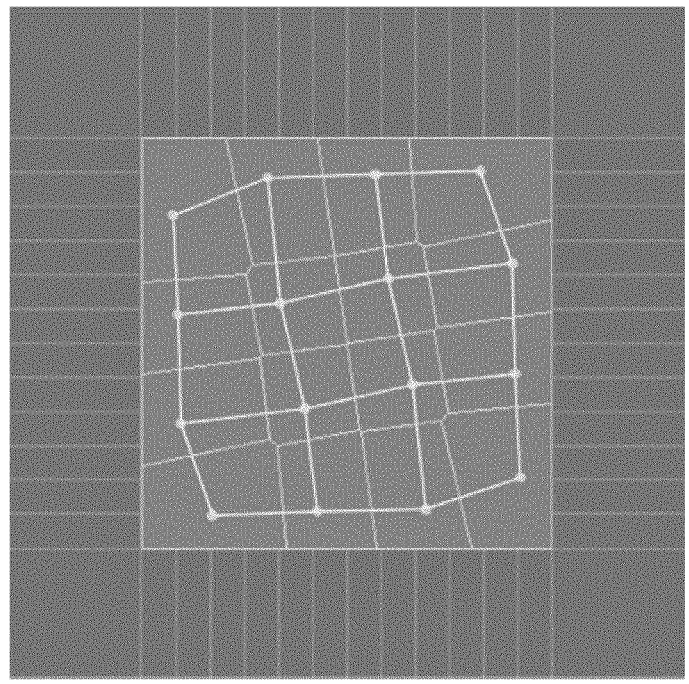
Figure 13D:
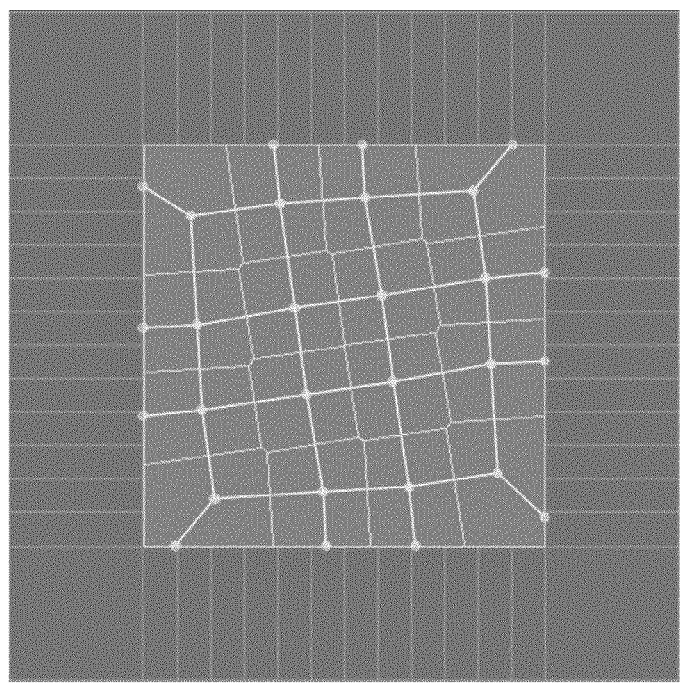
Figure 13E:
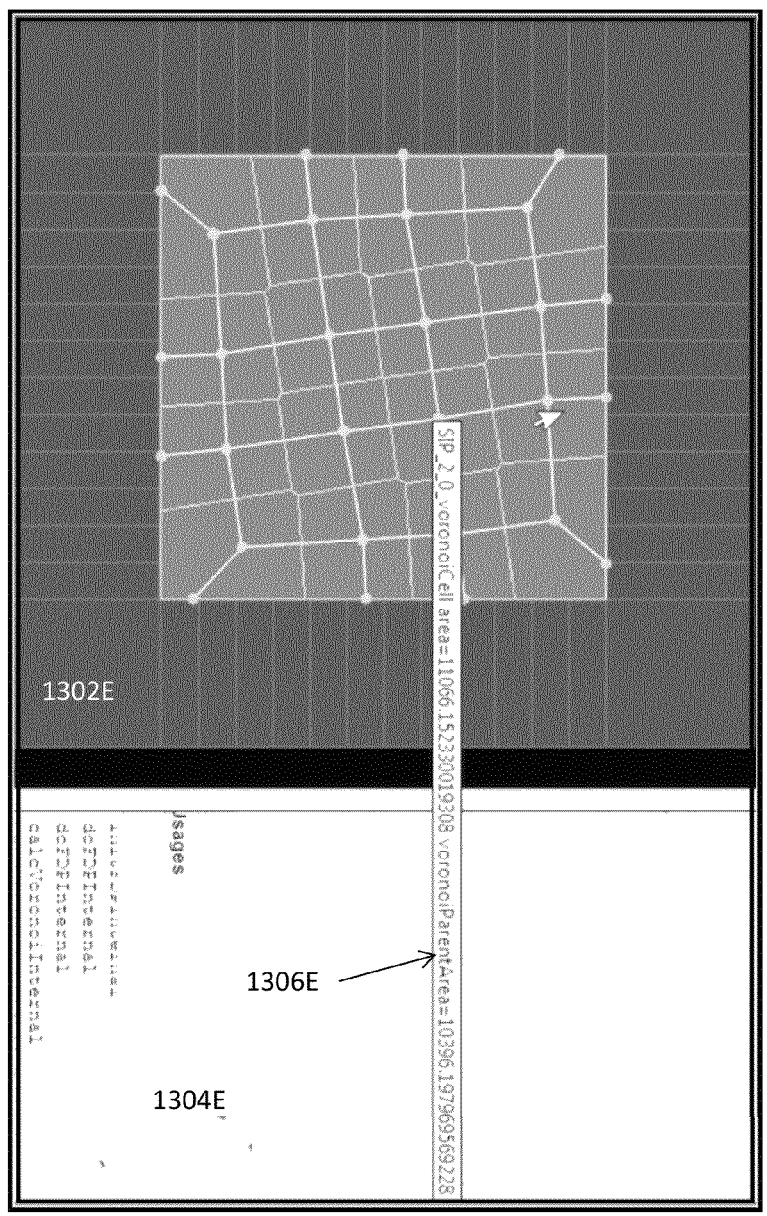

FIGS. 13C-D illustrates the iterative operations of the force model(s) on the nodes to move the nodes to locations where one or more convergence or stopping criteria (e.g., a target area criterion or a minimum or reduced energy level, etc.) are satisfied. FIG. 13D further illustrates anchoring the cells at the edges of the core area to the corresponding IO cells in the IO area. FIG. 13E illustrates a part of an exemplary user interface with a graphic display portion 1302E showing the state of the physical implementation of a design, a textual display portion 1304E showing more detailed design related information, and a context-based, brief summary 1306E of some design related information based on the user's input or manipulation of the design or of the input device.

Figure 14A:
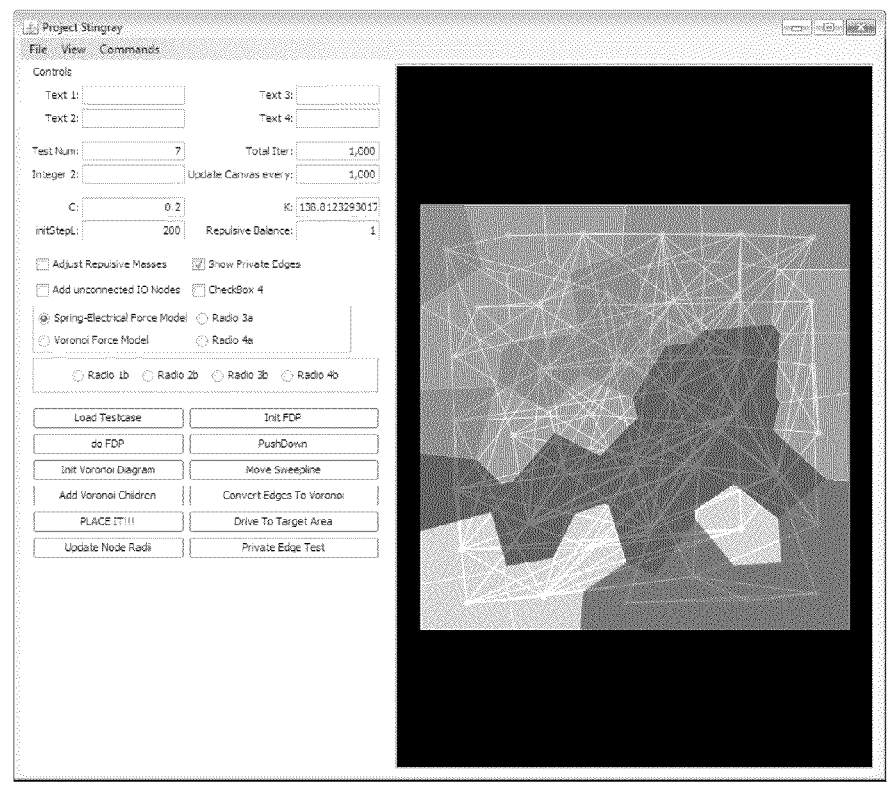
FIGS. 14A-B illustrate the generation of another exemplary floorplan or a placement layout during the implementation of the corresponding physical design using one or more force models operating on sets of cells representing the a physical design space of the physical design in some embodiments.
Figure 14B:
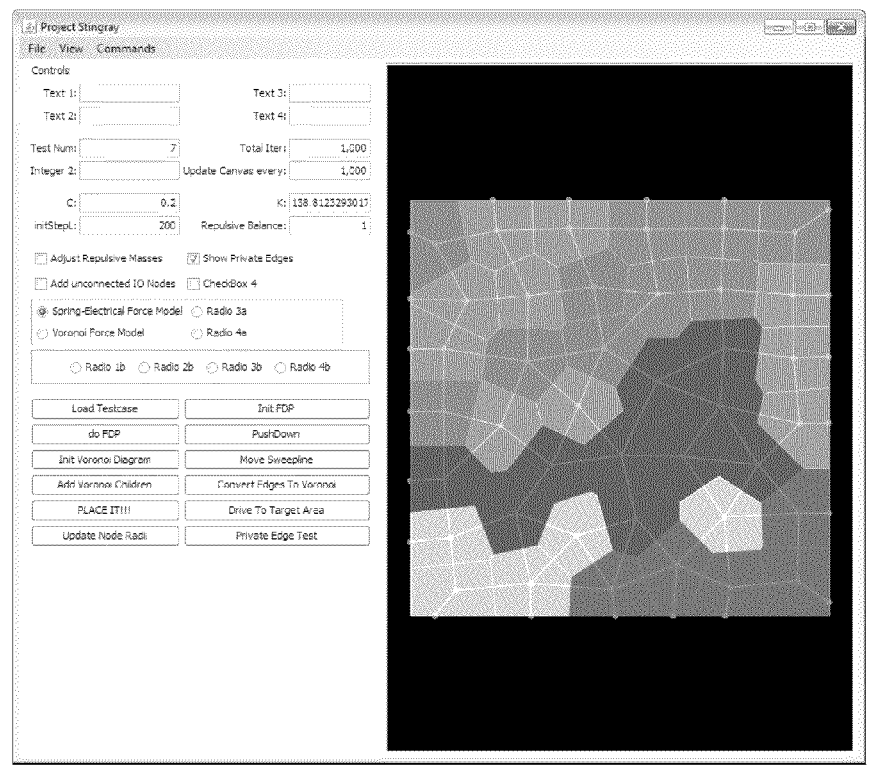

FIG. 14A illustrates a part of an exemplary user interface showing a set of mostly randomly interconnected nodes. FIG. 14B shows the final floorplan or placement layout of the same after applying various processes described herein to the initial set of nodes in FIG. 14B.

System Architecture Overview

Figure 15:
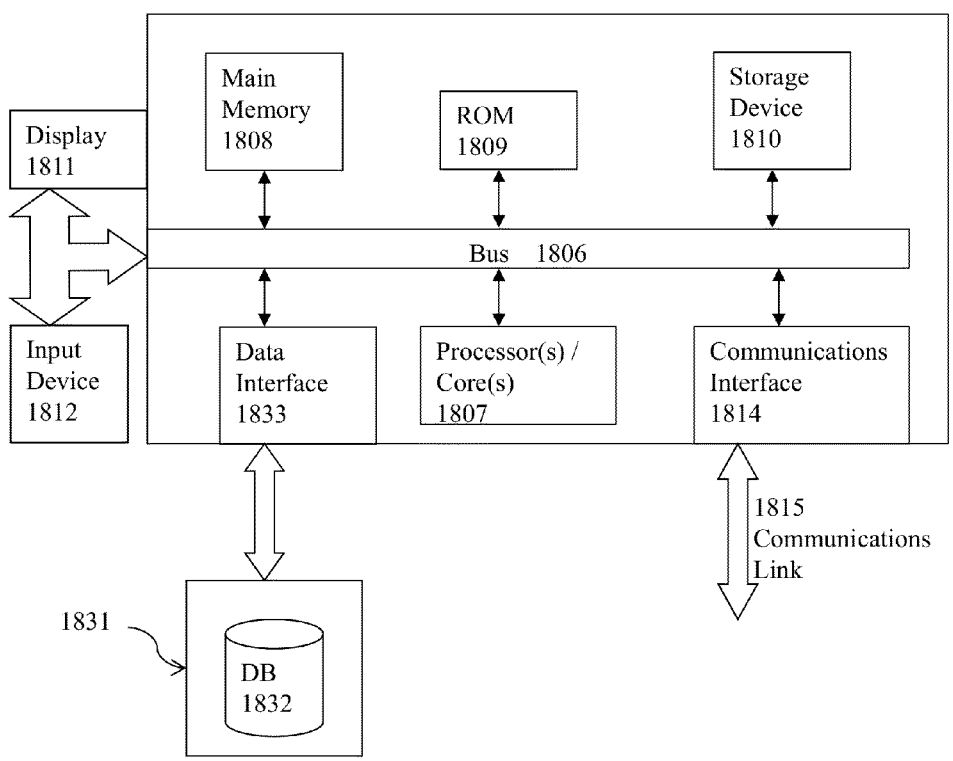
FIG. 15 illustrates a block diagram of an illustrative computing system 1400 suitable for implementing various embodiments described here.

FIG. 15 illustrates a block diagram of an illustrative computing system 1800 suitable for implementing various embodiment of the invention. For example, the exemplary computing system 1800 may be used to implement various processes as described in the preceding paragraphs and the figures such as various processes or modules of determining whether the first post is of interest, various analysis processes or modules, various other determining processes or modules, various processes or modules for performing various actions, etc. as described in the remainder of the Application. Computer system 1800 includes a bus 1806 or other communication mechanism for communicating information, which interconnects subsystems and devices, such as processor 1807, system memory 1808 (e.g., RAM), static storage device 1809 (e.g., ROM), disk drive 1810 (e.g., magnetic or optical), communication interface 1814 (e.g., modem or Ethernet card), display 1811 (e.g., CRT or LCD), input device 1812 (e.g., keyboard), and cursor control (not shown).

According to one embodiment of the invention, computer system 1800 performs specific operations by one or more processors or processor cores 1807 executing one or more sequences of one or more instructions contained in system memory 1808. Such instructions may be read into system memory 1808 from another computer readable/usable storage medium, such as static storage device 1809 or disk drive 1810. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention. In the single embodiment or in some embodiments, the one or more processors or processor cores 1807 may be used to perform various actions such as various actions, processes, or modules involving determining, analyzing, performing actions, etc. In some embodiments, at least one of the one or more processors or processor cores 1807 has the multithreading capability.

In one embodiment, the term "logic" shall mean any combination of software or hardware that is used to implement all or part of the invention. In the single embodiment or in some embodiments, the one or more processors or processor cores 1807 may be used to perform various acts such as various acts involving determining, analyzing, performing actions, etc. In some embodiments, at least one of the one or more processors or processor cores 1807 has the multithreading capability to execute a plurality of threads to perform various tasks as described in the preceding sections.

Various actions as described in the preceding paragraphs may be performed by using one or more processors, one or more processor cores, or combination thereof 1807. For example, various processes or modules involving the determining action, various analysis processes or modules, etc. may be performed by one or more processors, one or more processor cores, or combination thereof.

The term "computer readable storage medium" or "computer usable storage medium" as used herein refers to any non-transitory medium that participates in providing instructions to processor 1807 for execution. Such a medium may take many forms, including but not limited to, non-volatile media and volatile media. Non-volatile media includes, for example, optical or magnetic disks, such as disk drive 1810. Volatile media includes dynamic memory, such as system memory 1808.

Common forms of computer readable storage media includes, for example, electromechanical disk drives (such as a floppy disk, a flexible disk, or a hard disk), a flash-based, RAM-based (such as SRAM, DRAM, SDRAM, DDR, MRAM, etc.), or any other solid-state drives (SSD), a magnetic tape, any other magnetic or a magneto-optical medium, CD-ROM, any other optical medium, punch cards, paper tape, any other physical medium with patterns of holes, RAM, PROM, EPROM, FLASH-EPROM, any other memory chip or cartridge, or any other medium from which a computer can read. For example, the various forms of computer readable storage media may be used by the methods or the systems to store either temporarily or permanently information or data such as the one or more master regions, one or more master output layers, one or more global scratch layers, various transforms and inverse transforms, shapes, etc.

In an embodiment of the invention, execution of the sequences of instructions to practice the invention is performed by a single computer system 1800. According to other embodiments of the invention, two or more computer systems 1800 coupled by communication link 1815 (e.g., LAN, PTSN, or wireless network) may perform the sequence of instructions required to practice the invention in coordination with one another.

Computer system 1800 may transmit and receive messages, data, and instructions, including program, i.e., application code, through communication link 1815 and communication interface 1814. Received program code may be executed by processor 1807 as it is received, and/or stored in disk drive 1810, or other non-volatile storage for later execution. In an embodiment, the computer system 1800 operates in conjunction with a data storage system 1861, e.g., a data storage system 1861 that contains a database 1862 that is readily accessible by the computer system 1800. The computer system 1800 communicates with the data storage system 1861 through a data interface 1866. A data interface 1866, which is coupled to the bus 1806, transmits and receives electrical, electromagnetic or optical signals that include data streams representing various types of signal information, e.g., instructions, messages and data. In embodiments of the invention, the functions of the data interface 1866 may be performed by the communication interface 1814.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

What is claimed is:

1. A computer implemented method for implementing a physical design with force directed placement or floorplanning and layout decomposition, comprising:
    at least one processor performing a process, the process comprising:
    identifying a set of nodes for an area of an electronic design;
    partitioning the area of the electronic design into a set of cells using at least the set of nodes, wherein the set of cells includes a plurality of Voronoi cells; and
    generating the physical design for the area of the electronic design by using the at least one processor to apply one or more force models to morph at least some cells of the set of cells, wherein generating the physical design comprises:
        iteratively applying the one or more force models on the set of cells to move at least some nodes of the set of nodes of corresponding cells in the set of cells to respective new locations; and
        iteratively modifying at least some shapes of the corresponding cells based in part or in whole upon the respective new locations.

2. The computer implemented method of claim 1, in which the process further comprises:
    identifying conductivity information for the electronic design, wherein the physical design is generated using at least the conductivity information, without using information of pins; and
    determining the one or more force models based at least in part upon the set of nodes or the set of cells.

3. The computer implemented method of claim 1, in which the process further comprises:
    moving at least one node of the set of nodes by using the one or more force models to determine a new location for the at least one node.

4. The computer implemented method of claim 1, in which the process further comprises:
    updating at least one cell in the set of cells by changing a shape of the at least one cell based at least on the new location.

5. The computer implemented method of claim 1, in which the process further comprises:
    determining whether one or more convergence criteria are satisfied, wherein the physical design is generated using at least the conductivity information, without using netlists.

6. The computer implemented method of claim 1, in which the act of partitioning the area of the electronic design into the set of cells comprises:
    applying at least one force model of the one or more force models to the set of nodes to distribute the set of nodes in the area;
    identifying a decomposition process for the area of the electronic design; and
    generating the set of cells for the area by using at least the decomposition process to operate on the set of nodes.

7. The computer implemented method of claim 1, in which the act of generating the physical design for the area of the electronic design by applying one or more force models to morph at least some cells of the set of cells further comprises:
    updating at least one force model of the one or more force model based at least in part on the set of cells that have been iteratively modified; and
    determining whether the set of cells including the corresponding cells, which have been modified, satisfies a criterion.

8. The computer implemented method of claim 1, in which the one or more force models include a containment force model or a cell-based attractive model, and the physical design comprises a floorplan or a placement layout.

9. The computer implemented method of claim 2, the process further comprising:
    inferring additional conductivity information by using at least the set of cells; and
    configuring or reconfiguring conductivity for a first cell and a second cell in the set of cells so the first cell and the second cell have a uniform degree.

10. The computer implemented method of claim 1, in which the process further comprises:
    anchoring a second cell of the set of cells at an edge of the area to third cell outside the area.

11. The computer implemented method of claim 1, in which the process further comprises:
    adding one or more additional child nodes to a parent cell including a parent node in the set of cells;
    applying at least one force model of the one or more force models or an additional force model to the one or more additional child nodes in the parent cell to bind the one or more additional child nodes to the parent node; and
    determining a new set of cells by using at least the force models, the set of nodes, and the one or more additional set of nodes for the area of the electronic design.

12. An article of manufacture comprising a non-transitory computer readable storage medium storing thereupon a sequence of instructions which, when executed by at least one processor or at least one processor core, causes the at least one processor or the at least one processor core to perform a method for implementing a physical design with force directed placement or floorplanning and layout decomposition, the method comprising:
    at least one processor performing a process, the process comprising:
    identifying a set of nodes for an area of an electronic design;
    partitioning the area of the electronic design into a set of cells using at least the set of nodes, wherein the set of cells includes a plurality of Voronoi cells; and
    generating the physical design for the area of the electronic design by executing the sequence of instructions with the at least one processor to apply one or more force models to morph at least some cells of the set of cells, wherein generating the physical design comprises:
        iteratively applying the one or more force models on the set of cells to move at least some nodes of the set of nodes of corresponding cells in the set of cells to respective new locations; and
        iteratively modifying at least some shapes of the corresponding cells based in part or in whole upon the respective new locations.

13. The article of manufacture of claim 12, in which the process further comprises:
    identifying conductivity information for the electronic design, wherein the physical design is generated using at least the conductivity information, without using information of pins; and determining the one or more force models based at least in part upon the set of nodes or the set of cells.

14. The article of manufacture of claim 13, the process further comprising:
inferring additional conductivity information by using at least the set of cells; and
configuring or reconfiguring conductivity for a first cell and a second cell in the set of cells so the first cell and the second cell have a uniform degree.

15. The article of manufacture of claim 12, in which the process further comprises at least one of:
moving at least one node of the set of nodes by using the one or more force models to determine a new location for the at least one node;
updating at least one cell in the set of cells by changing a shape of the at least one cell based at least on the new location;
determining whether one or more convergence criteria are satisfied; and
anchoring a second cell of the set of cells at an edge of the area to third cell outside the area.

16. The article of manufacture of claim 12, in which the act of partitioning the area of the electronic design into the set of cells comprises:
applying at least one force model of the one or more force models to the set of nodes to distribute the set of nodes in the area;
identifying a decomposition process for the area of the electronic design; and
generating the set of cells for the area by using at least the decomposition process to operate on the set of nodes.

17. The article of manufacture of claim 12, in which the act of generating the physical design for the area of the electronic design by applying one or more force models to morph at least some cells of the set of cells further comprises:
updating at least one force model of the one or more force model based at least in part on the set of cells that have been iteratively modified; and
determining whether the set of cells including the corresponding cells, which have been modified, satisfies a criterion.

18. The article of manufacture of claim 12, in which the process further comprises:
adding one or more additional child nodes to a parent cell including a parent node in the set of cells;
applying at least one force model of the one or more force models or an additional force model to the one or more additional child nodes in the parent cell to bind the one or more additional child nodes to the parent node; and
determining a new set of cells by using at least the force models, the set of nodes, and the one or more additional set of nodes for the area of the electronic design.

19. A system for using virtual sales process engineering, comprising:
a computing system that comprises at least one processor having at least one core and is to:
identify a set of nodes for an area of an electronic design;
partition the area of the electronic design into a set of cells using at least the set of nodes, wherein the set of cells includes a plurality of Voronoi cells; and
generate the physical design for the area of the electronic design by using the at least one processor to apply one or more force models to morph at least some cells of the set of cells, wherein the computing system that is to generate the physical design is further to
iteratively apply the one or more force models on the set of cells to move at least some nodes of the set of nodes of corresponding cells in the set of cells to respective new locations; and
iteratively modify at least some shapes of the corresponding cells based in part or in whole upon the respective new locations.

20. The system of claim 19, in which the computing system is further to:
identify conductivity information for the electronic design, wherein the physical design is generated using at least the conductivity information, without using information of pins; and
determine the one or more force models based at least in part upon the set of nodes or the set of cells.

21. The system of claim 20, in which the computing system is further to:
infer additional conductivity information by using at least the set of cells; and
configure or reconfiguring conductivity for a first cell and a second cell in the set of cells so the first cell and the second cell have a uniform degree.

22. The system of claim 19, in which the computing system is further to:
move at least one node of the set of nodes by using the one or more force models to determine a new location for the at least one node;
update at least one cell in the set of cells by changing a shape of the at least one cell based at least on the new location;
determine whether one or more convergence criteria are satisfied; or
anchor a second cell of the set of cells at an edge of the area to third cell outside the area.

23. The system of claim 19, in which the computing system that is to partition the area of the electronic design into the set of cells is further to:
apply at least one force model of the one or more force models to the set of nodes to distribute the set of nodes in the area;
identify a decomposition process for the area of the electronic design; and
generate the set of cells for the area by using at least the decomposition process to operate on the set of nodes.

24. The system of claim 19, in which the computing system that is to generate the physical design for the area of the electronic design by applying one or more force models to morph at least some cells of the set of cells is further to:
update at least one force model of the one or more force model based at least in part on the set of cells that have been iteratively modified; and
determine whether the set of cells including the corresponding cells, which have been modified, satisfies a criterion.

25. The system of claim 19, in which the computing system is further to:
add one or more additional child nodes to a parent cell including a parent node in the set of cells;
apply at least one force model of the one or more force models or an additional force model to the one or more additional child nodes in the parent cell to bind the one or more additional child nodes to the parent node; and
determine a new set of cells by using at least the force models, the set of nodes, and the one or more additional set of nodes for the area of the electronic design.

* * * * *